US010686400B2

(12) United States Patent
Angel et al.

(10) Patent No.: US 10,686,400 B2
(45) Date of Patent: Jun. 16, 2020

(54) TANDEM PHOTOVOLTAIC MODULE WITH DIFFRACTIVE SPECTRAL SEPARATION

(71) Applicant: THE ARIZONA BOARD OF REGENTS ON BEHALF OF THE UNIVERSITY OF ARIZONA, Tucson, AZ (US)

(72) Inventors: Roger P Angel, Tucson, AZ (US); Raymond K Kostuk, Tucson, AZ (US); Zachary Holman, Phoenix, AZ (US); Brian M Wheelwright, Tucson, AZ (US)

(73) Assignee: THE ARIZONA BOARD OR REGENTS ON BEHALF OF THE UNIVERSITY OF ARIZONA, Tucson, AZ (US)

(*) Notice: Subject to any disclaimer, the term of this patent is extended or adjusted under 35 U.S.C. 154(b) by 359 days.

(21) Appl. No.: 15/735,639

(22) PCT Filed: Jun. 8, 2016

(86) PCT No.: PCT/US2016/036506
§ 371 (c)(1),
(2) Date: Dec. 12, 2017

(87) PCT Pub. No.: WO2016/200988
PCT Pub. Date: Dec. 15, 2016

(65) Prior Publication Data
US 2019/0393832 A1 Dec. 26, 2019

Related U.S. Application Data

(60) Provisional application No. 62/175,051, filed on Jun. 12, 2015.

(51) Int. Cl.
*H02N 6/00* (2006.01)
*H01L 31/042* (2014.01)
(Continued)

(52) U.S. Cl.
CPC ............ *H02S 40/22* (2014.12); *H01L 31/078* (2013.01); *G02B 5/1871* (2013.01); *G02B 27/4244* (2013.01)

(58) Field of Classification Search
CPC ... H02S 40/22; H01L 31/078; H01L 31/0549; H01L 31/0543; G02B 27/4244; G02B 5/1871; G02B 5/1819; Y02E 10/52
See application file for complete search history.

(56) References Cited

U.S. PATENT DOCUMENTS 608,755 A 8/1898 Cottle
642,196 A 1/1900 Belcher
(Continued)

FOREIGN PATENT DOCUMENTS

AU 2009246638 11/2009
CA 2722714 7/2014
(Continued)

OTHER PUBLICATIONS

International Preliminary Report on Patentability dated May 6, 2016 from International Application PCT/US2014/061584.
(Continued)

*Primary Examiner* — Angelo Trivisonno
(74) *Attorney, Agent, or Firm* — Snell & Wilmer L.L.P.

(57) ABSTRACT

A solar PV module is disclosed having two types of laterally-separated coplanar cells with different bandgaps to improve conversion efficiency. A diffracting entrance window directs sunlight with wavelengths shorter than a separation 5 wavelength ks is directed largely to the first type of wider bandgap cells. Sunlight with wavelengths longer than a separation wavelength ks is directed largely to the second type of narrower bandgap cells. The separation wavelength is chosen so that each cell is illuminated largely by that part of the solar spectrum to which it has the higher conversion (Continued)

efficiency, resulting in an overall conversion efficiency higher than 10 for either type of cell used alone. The wider bandgap cells are configured on a planar support in separated parallel strips, with the narrower bandgap cells largely filling the area between these strips.

5 Claims, 16 Drawing Sheets

(51) Int. Cl.
*H02S 40/22* (2014.01)
*H01L 31/078* (2012.01)
*G02B 5/18* (2006.01)
*G02B 27/42* (2006.01)

(56) References Cited

U.S. PATENT DOCUMENTS

| | | |
|---|---|---|
| 670,917 A | 3/1901 | Eneas |
| 811,274 A | 1/1906 | Carter |
| 2,661,672 A | 12/1953 | Fairbanks |
| 2,827,690 A | 3/1958 | Brown |
| 2,904,612 A | 9/1959 | Regnier |
| 3,427,200 A | 2/1969 | Ernest et al. |
| 3,552,941 A | 1/1971 | Giffen |
| 3,586,492 A | 6/1971 | McMaster |
| 3,756,797 A | 9/1973 | Akeyoshi |
| 3,977,773 A | 8/1976 | Hubbard |
| 4,074,996 A | 2/1978 | Hagedorn |
| 4,088,470 A | 5/1978 | Bourg et al. |
| 4,105,429 A | 8/1978 | Delgado |
| 4,107,521 A | 8/1978 | Winters |
| 4,154,219 A | 5/1979 | Gupta et al. |
| 4,180,414 A | 12/1979 | Diamond et al. |
| 4,245,895 A | 1/1981 | Wildenrotter |
| 4,313,746 A | 2/1982 | Juras |
| 4,354,193 A | 10/1982 | Werner |
| 4,404,565 A | 9/1983 | Gurney et al. |
| 4,436,373 A | 3/1984 | Kirsch |
| 4,461,278 A | 7/1984 | Mori |
| 4,473,065 A | 9/1984 | Bates |
| 4,525,196 A | 6/1985 | Fecik et al. |
| 4,535,961 A | 8/1985 | Sobeczak |
| 4,547,650 A | 10/1985 | Arditty |
| 4,568,156 A | 2/1986 | Dane |
| 4,575,207 A | 3/1986 | August |
| 4,616,909 A | 10/1986 | Dane |
| 4,678,292 A | 7/1987 | Miyatani et al. |
| 4,805,006 A | 2/1989 | Yamagushi et al. |
| 4,830,678 A | 5/1989 | Todorof et al. |
| 4,909,819 A | 3/1990 | McMaster |
| 4,999,059 A | 3/1991 | Bagno |
| 5,118,543 A | 6/1992 | McColl |
| 5,129,934 A | 7/1992 | Koss |
| 5,143,535 A | 9/1992 | Herrington |
| 5,147,437 A | 9/1992 | Bristol |
| 5,169,456 A | 12/1992 | Johnson |
| 5,215,567 A | 6/1993 | Clark |
| 5,281,249 A | 1/1994 | Hampton et al. |
| 5,363,116 A | 11/1994 | Allen |
| 5,460,659 A | 10/1995 | Krut |
| 5,593,901 A | 1/1997 | Oswald et al. |
| 5,695,538 A | 12/1997 | Goolsbay |
| 5,697,999 A | 12/1997 | Reunamaki |
| 5,787,878 A | 8/1998 | Ratliff |
| 5,849,056 A | 12/1998 | May |
| 6,034,319 A | 3/2000 | Falbel |
| 6,091,017 A | 7/2000 | Stern |
| 6,123,067 A | 9/2000 | Warrick |
| 6,257,022 B1 | 7/2001 | Caplan et al. |
| 6,301,932 B1 | 10/2001 | Allen et al. |
| 6,375,135 B1 | 4/2002 | Eason et al. |
| 6,378,339 B1 | 4/2002 | Zalesak et al. |
| 6,498,290 B1 | 12/2002 | Lawheed |
| 6,541,694 B2 | 4/2003 | Winston |
| 6,563,040 B2 | 5/2003 | Hayden et al. |
| 6,566,635 B1 | 5/2003 | Matsen et al. |
| 6,629,436 B1 | 10/2003 | Skeen |
| 6,739,729 B1 | 5/2004 | Blackmon et al. |
| 6,848,442 B2 | 2/2005 | Haber |
| 6,895,145 B2 | 5/2005 | Ho |
| 7,076,965 B2 | 7/2006 | Lasich |
| 7,258,320 B2 | 8/2007 | Tai |
| 7,297,865 B2 | 11/2007 | Terao et al. |
| 7,380,549 B1 | 6/2008 | Ratliff |
| 7,503,189 B2 | 3/2009 | Fukuyama et al. |
| 7,506,847 B2 | 3/2009 | Bailey |
| 8,082,755 B2 | 12/2011 | Angel |
| 8,319,697 B2 | 11/2012 | Conrad |
| 8,350,145 B2 | 1/2013 | Angel |
| 8,430,090 B2 | 4/2013 | Angel |
| 8,505,867 B2 | 8/2013 | Conrad |
| 8,604,333 B2 | 12/2013 | Angel et al. |
| 8,662,072 B2 | 3/2014 | Butler |
| 9,318,635 B2 | 4/2016 | Luo |
| 2001/0036024 A1 | 11/2001 | Wood |
| 2003/0005954 A1 | 1/2003 | Emoto et al. |
| 2003/0070705 A1 | 4/2003 | Hayden et al. |
| 2004/0107731 A1 | 6/2004 | Doehring et al. |
| 2005/0051205 A1 | 3/2005 | Mook et al. |
| 2005/0081909 A1 | 4/2005 | Paull |
| 2005/0166957 A1 | 8/2005 | Imoto et al. |
| 2006/0054162 A1 | 3/2006 | Romeo |
| 2006/0057847 A1 | 3/2006 | Yanagawa et al. |
| 2006/0231133 A1 | 10/2006 | Fork |
| 2006/0243319 A1 | 11/2006 | Kusek et al. |
| 2007/0012934 A1 | 1/2007 | Abu-Ageel |
| 2007/0089774 A1 | 4/2007 | Lasich |
| 2007/0089778 A1 | 4/2007 | Horne et al. |
| 2007/0095341 A1 | 5/2007 | Kaneff |
| 2007/0256726 A1 | 11/2007 | Fork et al. |
| 2007/0272666 A1 | 11/2007 | O'Brien |
| 2007/0277869 A1* | 12/2007 | Shan .............. G02B 5/045 136/246 |
| 2008/0000516 A1 | 1/2008 | Shifman |
| 2008/0047605 A1 | 2/2008 | Benitez et al. |
| 2008/0053513 A1 | 3/2008 | Palmer |
| 2008/0092877 A1 | 4/2008 | Monsebroten |
| 2008/0185034 A1 | 8/2008 | Corio |
| 2009/0032102 A1 | 2/2009 | Chen et al. |
| 2009/0056790 A1 | 3/2009 | Tian |
| 2009/0126778 A1 | 5/2009 | Brounne et al. |
| 2009/0277224 A1 | 11/2009 | Angel et al. |
| 2009/0277498 A1 | 11/2009 | Angel |
| 2010/0037937 A1 | 2/2010 | Sater |
| 2010/0095999 A1 | 4/2010 | Menon |
| 2010/0126556 A1 | 5/2010 | Benitez et al. |
| 2010/0139645 A1 | 6/2010 | Whipple |
| 2012/0174966 A1 | 7/2012 | Snipes |
| 2012/0192919 A1 | 8/2012 | Mizuyama |
| 2012/0229911 A1 | 9/2012 | Rodriguez-Parada et al. |
| 2012/0260908 A1 | 10/2012 | Orsello |
| 2012/0312349 A1 | 12/2012 | Farberov |
| 2012/0316017 A1 | 12/2012 | Chiel |
| 2012/0318324 A1 | 12/2012 | Ming et al. |
| 2013/0068285 A1 | 3/2013 | Ni et al. |
| 2013/0206935 A1 | 8/2013 | Majid et al. |
| 2013/0323415 A1 | 12/2013 | Brackley |
| 2014/0053607 A1 | 2/2014 | Angel |
| 2014/0090687 A1 | 4/2014 | Den Boer et al. |
| 2014/0116419 A1 | 5/2014 | Hernandez et al. |
| 2014/0130843 A1 | 5/2014 | Kostuk et al. |
| 2014/0160784 A1 | 6/2014 | Badahdah et al. |
| 2014/0201109 A1 | 7/2014 | Tilley |
| 2014/0209146 A1 | 7/2014 | Park |
| 2014/0238387 A1 | 8/2014 | Kroyzer et al. |
| 2014/0251308 A1 | 9/2014 | Wyle et al. |
| 2014/0261387 A1 | 9/2014 | Hansen |
| 2014/0261392 A1 | 9/2014 | Lambrecht |
| 2014/0374550 A1 | 12/2014 | Straeter |
| 2015/0303867 A1 | 10/2015 | Angel |
| 2015/0316639 A1 | 11/2015 | Russ |
| 2015/0323124 A1 | 11/2015 | Erdos |

(56) References Cited

U.S. PATENT DOCUMENTS

| | | | |
|---|---|---|---|
| 2016/0079461 | A1 | 3/2016 | Angel |
| 2016/0238189 | A1 | 8/2016 | Angel |
| 2016/0251093 | A1 | 9/2016 | Hijmans |

FOREIGN PATENT DOCUMENTS

| | | |
|---|---|---|
| CN | 2597897 | 1/2004 |
| CN | 2599483 | 1/2004 |
| DE | 3104690 | 8/1982 |
| DE | 202007016715 | 3/2008 |
| EP | 1903155 | 3/2008 |
| EP | 1956662 | 8/2008 |
| EP | 1956662 | 12/2009 |
| FR | 2434343 | 4/1980 |
| GB | 770097 | 3/1957 |
| GB | 1529409 | 10/1978 |
| GB | 2471816 | 10/2012 |
| JP | 491610 | 1/1974 |
| JP | 58194751 | 11/1983 |
| JP | 6060934 | 4/1985 |
| JP | 2003069069 | 6/1986 |
| JP | 63021229 | 1/1988 |
| JP | 0598895 | 4/1993 |
| JP | 8194103 | 7/1996 |
| JP | 61119081 | 3/2000 |
| JP | 2000091612 | 3/2000 |
| JP | 2000243983 | 9/2000 |
| JP | 2003258291 | 9/2003 |
| JP | 2005206458 | 8/2005 |
| TW | 332104 | 11/2007 |
| WO | WO2005042420 | 5/2005 |
| WO | WO2008013976 | 1/2008 |
| WO | WO2008043871 | 4/2008 |
| WO | WO2009008996 | 1/2009 |
| WO | WO2009121174 | 10/2009 |
| WO | WO2010051599 | 5/2010 |
| WO | WO2010091391 | 8/2010 |
| WO | WO2012032462 | 3/2012 |
| WO | WO2012097260 | 7/2012 |
| WO | WO 2015117134 | 8/2015 |

OTHER PUBLICATIONS

International Search Report and Written Opinion dated Jan. 27, 2015 from corresponding International Application PCT/US2014/061584.
International Preliminary Report on Patentability dated Jun. 11, 2015 from corresponding International Application PCT/US2013/071974.
International Search Report and Written Opinion dated Apr. 2, 2014 from corresponding International Application PCT/US2013/071974.
Nishi et al., USPTO Translation of JP-60-60934, created Dec. 2015, pp. 1-22.
International Search Report and Written Opinion dated Aug. 25, 2009 from International Application PCT/US2009/043381.
International Search Report and Written Opinion from Int'l Application No. PCT/US09/043377 dated May 28, 2010.
International Preliminary Report on Patentability from Int'l Application No. PCT/US09/043381 dated Aug. 16, 2010.
International Search Report and Written Opinion from Int'l Application No. PCT/US09/043378 dated Jun. 9, 2010.
Reply to EPO Communication Pursuant to Rules 161(1) and 162 EPC from related EPC Application No. 09 747 260.9, based on PCT/US2009/043378.
International Preliminary Report on Patentability from Int'l Application No. PCT/US2009/043377 (corrected version) dated Jan. 20, 2011.
Reply to EPO Communication Pursuant to Rules 161(1) and 162 EPC from corresponding EPC Application No. 09 747 261.7, based on PCT/US2009/043381.
Reply to EPO Communication Pursuant to Rules 161(1) and 162 EPC from related EPC Application No. 09 747 259.1, based on PCT/US2009/043377.
Office Action dated Nov. 23, 2012 in German Application No. 11 2009 001 132.2-33.
Office Action in Japanese Application No. 2011-509577.
Office Action in Chinese Application No. 200980116969.2.
Office Action dated Oct. 30, 2012 in Application No. GB1019206.0.
Office Action dated Nov. 16, 2012 in Chinese Application No. 200980116959.9.
Office Action dated Nov. 23, 2012 in German Application No. 11 2009 001 135.7-33.
Office Action in Mexican Application No. MX/a/2010/012356.
Office Action dated Sep. 13, 2012 in Mexican Application No. MX/a/2010/012355.
Examination Report dated Sep. 25, 2012 in European Application No. 09747261.7.
Office Action dated Aug. 22, 2012 in Japanese Application No. 2011-509579.
Examiner's Report in Australian Application No. 2009246638.
Office Action dated Sep. 15, 2012 in Japanese Application No. 2011-509578.
Examination Report dated Jul. 10, 2012 in European Application No. 09747261.7.
Examination Report dated May 21, 2012 in European Application No. 09747260.9.
Office Action in Mexican Application No. MX/a/2010/12356.
Combined Search and Examination Report dated Jul. 24, 2012 in Great Britain Application No. 1203267.8.
Examination Report dated Jul. 24, 2012 in Great Britain Application No. 1019139.3.
Office Action dated Jul. 3, 2012 in Chinese Application No. 20090116968.8.
Examiner's Report in European Application No. 09747259.1.
Examiner's Report in Great Britain Application No. 1019206.0.
AU; Examination Report dated May 9, 2011 in Application No. 2009246637.
GB; Examination Report dated Sep. 16, 2011 in Application No. GB1019160.9.
AU; Examination Report dated Oct. 4, 2011 in Application No. 2009246639.
DE; Office Action dated Jan. 10, 2012 in Application No. 11 2009 001 131.4-45.
AU; Examination Report dated May 10, 2011 in Application No. 2009246638.
KR; Notification of Provisional Rejection dated Sep. 8, 2011 in Application No. 10-2010-7025551.
PCT; International Preliminary Report on Patentability dated Mar. 29, 2011 in Application No. PCT/US2009/043378.
GB; Examination Report dated Sep. 16, 2011 in Application No. GB1019139.3.
GB; Examination Report dated Jan. 11, 2012 in Application No. GB1019139.3.
USPTO; Restriction Requirement dated Dec. 2, 2016 in U.S. Appl. No. 14/632,637.
USPTO; Non-Final Office Action dated Jun. 17, 2015 in U.S. Appl. No. 14/071,417.
USPTO; Final Office Action dated Jan. 8, 2016 in U.S. Appl. No. 14/071,417.
USPTO; Advisory Action dated Mar. 24, 2016 in U.S. Appl. No. 14/071,417.
USPTO; Non-Final Office Action dated Aug. 17, 2016 in U.S. Appl. No. 14/071,417.
USPTO; Notice of Allowance dated Aug. 24, 2011 in U.S. Appl. No. 12/463,026.
USPTO; Notice of Allowance dated Oct. 4, 2012 in U.S. Appl. No. 12/463,016.
USPTO; Office Action dated Jan. 20, 2012 in U.S. Appl. No. 12/463,016.
USPTO; Office Action Restriction dated Oct. 11, 2011 in U.S. Appl. No. 12/463,016.
USPTO; Restriction Requirement dated Aug. 31, 2012 in U.S. Appl. No. 12/463,001.

(56) References Cited

OTHER PUBLICATIONS

USPTO; Non-Final Office Action dated Nov. 21, 2012 in U.S. Appl. No. 12/463,001.
USPTO; Notice of Allowance dated Mar. 5, 2013 in U.S. Appl. No. 12/463,001.
USPTO; Non-Final Office Action dated Feb. 14, 2013 in U.S. Appl. No. 13/302,084.
USPTO; Final Office Action dated May 29, 2013 in U.S. Appl. No. 13/302,084.
USPTO; Notice of Allowance dated Aug. 7, 2013 in U.S. Appl. No. 13/302,084.
PCT; International Search Report and Written Opinion dated Nov. 2, 2016 in Intl Application No. PCT/US16/45355.
USPTO; Non-Final Office Action dated Dec. 29, 2016 in U.S. Appl. No. 15/030,692.
USPTO; Restriction Requirement Office Action dated Feb. 14, 2017 in. U.S. Appl. No. 14/647,589.
USPTO; Final Office Action dated Apr. 21, 2017 in U.S. Appl. No. 14/071,417.
USPTO; Notice of Allowance dated May 1, 2017 in U.S. Appl. No. 15/030,692.
USPTO; Non-Final Office Action dated Jun. 20, 2017 in U.S. Appl. No. 14/647,589.
USPTO; Advisory Action dated Aug. 1, 2017 in U.S. Appl. No. 14/071,417.
USPTO; Non-Final Office Action dated Sep. 29, 2017 in U.S. Appl. No. 14/071,417.
USPTO; Notice of Allowance dated Apr. 12, 2018 in U.S. Appl. No. 14/647,589.
USPTO; Final Office Action dated Apr. 27, 2018 in U.S. Appl. No. 14/071,417.
USPTO; Restriction requirement Office Action dated Apr. 5, 2018 in U.S. Appl. No. 15/543,625.
Office Action dated Nov. 23, 2012 in Ferman Application No. 11 2009 001 132.2-33.
Decision to Grant Pursuant to Article 97(1) EPC dated Mar. 28, 2013 from EP Application No. 09747261.7.
DE; Office Action dated Jun. 30, 2015 in Application No. 11 2009 001 131.4-45.
DE; Office Action dated Mar. 13, 2018 in Application No. 11 2009 001 131.4-45.
MX; 1st Office Action dated May 27, 2013 in Mexico Application No. 10/12354.
MX; 2nd Office Action dated Dec. 21, 2013 in Mexico Application No. 10/12354.
MX; 3rd Office Action dated Aug. 5, 2014 in Mexico Application No. 10/12354.
CN 2nd OA dated Oct. 14, 2013 in Chinese Application No. 200980116959.9.
IN First Examination Report dated Oct. 13, 2014 in Indian Application No. 4323/KOLNP/2010.
CA First Office Action dated Nov. 27, 2012 in Canadian App No. 2722714.
Canadian Notice of Allowance dated Mar. 14, 2014 in Canadian App No. 2722714.
EP Comunication pursuant to Article 94(3) EPC dated Jul. 8, 2015 in EP Application No. 09747260.9.
DE Office Action dated Apr. 12, 2018 in German Application No. 112008001135.7.
JP Notice of Allowance dated May 21, 2013 from JP Application No. 2011-509578.
CN 2nd Office Action dated Jun. 3, 2013 in Chinese Application No. 200980116968.8.
CN Third Office Action dated Dec. 23, 2013 in Chinese Application No. 200980116968.8.
First Examination Report dated Nov. 30, 2015 in India Application No. 4327/KOLNP/2010.
Exam Report in Chile Application No. 2015-01453.
International Search Report and Written Opinion dated May 3, 2016 from corresponding International Application PCT/US2016/20415.
International Preliminary Report on Patentability dated Sep. 14, 2017 from International Application PCT/US2014/06/020415.
International Preliminary Report on Patentability dated Jul. 27, 2017 from International Application PCT/US2016/013670.
International Search Report and Written Opinion dated Jun. 9, 2016 from corresponding International Application PCT/US2016/013670.
International Preliminary Report on Patentability dated Feb. 15, 2018 from International Application PCT/US2016/45355.
Leland, J. E90: Self-Replicating Milling Machine. Blog with photos (online). Swarthmore College, 2012. (Retrieved on Jul. 31, 2013).
Dan Friedman, National Solar Technology Roadmap: Concentrator PV, Management Report NREL/MP-520-41735, Solar Energy Technologies Program, Jun. 2007, pp. 1-3.
Geoffrey S. Kinsey, et al., Multijunction Solar Cells for Dense-Array Concentrators, pp. 625-627, 2006, 1-4244-0016-3, IEEE.
David Faiman, Large-Area Concentrators, 2nd Workshop on "The path to ultra-high efficient photovoltaics," Oct. 3-4, 2002, pp. 1-8, JRC Ispra, Italy.
Anja Royne, et al., Cooling of Photovoltaic Cells Under Concentrated Illumination: a Critical Review, Solar Energy Materials & Solar Cells, 2005 (available on-line October.
Geoffrey S. Kinsey et al., Concentrator Multijunction Solar Cell Characteristics Under Variable Intensity and Temperature, Progress in Photovoltaics: Research and.
Sarah Kurtz, Opportunities and Challenges for Development of a Mature Concentrating Photovoltaic Power Industry, Technical Report NRELITP-5200-43208, June.
Ugur Ortabasi et al., Dish/Photovoltaic Cavity Converter (PVCC) System for Ultimate Solar-to-Electricity Conversion Efficiency General Concept and First Performance.
Kumer et al. "Measuring Surface slope error on precision aspheres", (2007), Proc. of SPIE vol. 6671., pp. 1-9.
Minano et al., "Free-firm optics for Fresnel-lens-based photovoltaic concentrators.", Optics Express, vol. 21, No. S3, Apr. 22, 2013, pp. A496.
International Search Report and Written Opinion dated Sep. 13, 2016 from corresponding International Application PCT/US2016/036506.
International Preliminary Report on Patentability dated Dec. 21, 2017 from corresponding International Application PCT/US2016/036506.
USPTO; Non-Final Office Action dated Jul. 27, 2018 in U.S. Appl. No. 15/543,625.
International Search Report and Written Opinion dated Sep. 18, 2018 in PCT Application No. PCT/US18/30491.
USPTO; Final Office Action dated Feb. 19, 2019 in U.S. Appl. No. 15/543,625.
USPTO; Notice of Allowance dated May 1, 2019 in U.S. Appl. No. 15/543,625.
USPTO; Non-Final Office Action dated Apr. 19, 2019 in U.S. Appl. No. 15/694,327.
USPTO; Non-Final Office Action dated Apr. 18, 2019 in U.S. Appl. No. 15/748,792.

\* cited by examiner

TANDEM PHOTOVOLTAIC MODULE WITH DIFFRACTIVE SPECTRAL SEPARATION

CROSS REFERENCE TO RELATED APPLICATIONS

This application is a U.S. National Phase filing under 35 U.S.C. § 371 of PCT/US2016/036506, filed on Jun. 8, 2016, which claims priority to U.S. Provisional Patent Application Ser. No. 62/175,051 filed on Jun. 12, 2015, both of which are incorporated herein by reference in their entirety.

FIELD OF INVENTION

The present invention relates to the generation of electrical power using photovoltaic cells.

BACKGROUND

In the past, photovoltaic (PV) cells have been widely used to convert sunlight into electricity. A plurality of cells may be located behind a glass sheet to form a PV module. PV modules may receive a fraction of all the light that enters the glass, both direct sunlight and diffuse skylight. However, the efficiency of conversion of the total amount of incident solar energy is not high; for example, little more than 20% conversion may be achieved in current commercial PV modules. This limitation arises in part because sunlight comprises a broad range of wavelengths, and conventional PV modules use a single semiconductor type. While any given semiconductor may convert with high efficiency at a given characteristic wavelength, it is less efficient at other wavelengths. In the relatively inefficient spectral regions of any given PV cell, only a small amount of the available solar energy may be converted into electricity.

A PV module with higher overall efficiency may be preferred over a conventional module, provided the overall cost is not increased so much as to offset the efficiency gain. Sunlight may potentially be converted into electricity with higher overall efficiency than is possible with any one semiconductor, by dividing the solar spectrum and using the different parts to power PV cells using different semiconductors, each cell being illuminated preferentially by those parts of the spectrum which it converts with highest efficiency. One approach taken in the past used different semiconductors stacked on top of each other, forming a multijunction cell. In such a multijunction cell, different spectral bands separate out by absorption and conversion as sunlight travels down through the stack. However, this multijunction approach has typically been limited to expensive semiconductors and manufacturing techniques. To reduce the overall cost of energy generation by this approach, typically a small multijunction cell has been used in conjunction with optics to collect a large area of direct sunlight and strongly focus it onto the small cell area. However, in such configurations, the diffuse component of sunlight, which is typically between 20% and 40% of the total input, is nearly all lost, and in many cases system cost is increased because of the additional focusing optics and dual axis tracker required.

Other methods to use combinations of semiconductors of smaller area and/or of lower cost have been proposed, in which sunlight is first passed through optics which spatially separate the spectrum, directing different parts of the spectrum to different separated cells to better match their different spectral responses.

In prior art, Newton ("Opticks" 1704) provides a glass prism to separate sunlight into distinct spectral bands by refraction. Such refractive dispersion has the advantage of unambiguous wavelength separation, with angular deviation decreasing monotonically as wavelength is increased, but has the disadvantage that the angular separation is small. In a patent application (US 2010/0095999 A1) "Ultra-high efficiency multi junction solar cells using polychromatic diffractive concentrators", inventor Menon proposes dispersion by a phase-plate and lens combination, the lenses focusing different wavelengths onto different laterally arranged cells. Diffraction by the phase plate gives higher angular spectral dispersion than a prism; however the design does not account for the fact that diffraction of any specific wavelength from the broad solar spectrum is generally in multiple orders, each being deflected (or directly transmitted) in a different direction. In another patent application, (US 20120318324 A1) "Laterally Arranged Multiple-Bandgap Solar Cells" 2012, inventors Ning and Caselli show laterally-arranged multiple bandgap solar cells and a notional depiction of dispersive concentrators positioned above to provide light to a surface of each of the cells, but do not provide specifics about the nature of the spectral separation, whether refractive or dispersive.

Zhang et al., Journal of Photonics for Energy, 2013, show a configuration with sunlight passing through a flat window of holographic lenses to PV cells of two different types. The lenses partially focus a band of the solar spectrum onto strips of cells of one type oriented perpendicular to the entrance window, while remaining light passes by to sheet of solar cells of another type oriented parallel to the entrance window.

In general, the prior art suffers from one or more of the following limitations: (1) it may not be configurable to have a large fraction of the solar energy entering a module directed to PV cells, thus losing area efficiency and driving up total area and cost; (2) the total cell area to convert all the entering sunlight may be significantly larger than the aperture area, thus driving up cell area and cost; (3) it may use a complex and thus expensive combination of dispersive elements and concentrating optics to obtain spectral separation; (4) the spectrally separating optics may direct some part of the solar spectrum to the targeted cell, while at the same time misdirect other parts of the spectrum—this is a common deficiency for diffractive spectral separation, when only a part of the solar spectrum is efficiently diffracted in any given one direction; and (5) they may use concentration and as a result lose some or most of the diffuse light component.

SUMMARY

It is an object of the present invention to improve the overall conversion efficiency of PV modules, by incorporation of two different PV cell types, each type having high efficiency with respect to a different part of the solar spectrum. It is a further object to convert the sunlight energy entering the module (direct sunlight plus diffuse skylight), with higher overall efficiency than would be possible with a module using PV cells of any one single type. To maintain good efficiency to the diffuse sky component as well as to direct sunlight, it is an object to 1) use PV cells that together cover essentially the whole area of the module and 2) to allow diffuse light to pass through to the cells with minimal loss by back-scattering. It is a further object to use cell types which can be manufactured in large area at low cost. An additional object is to incorporate diffractive optics in front of the cells which result in each cell type receiving a large fraction of all the direct sunlight incident on the module in the wavelength range to which it is most sensitive.

A solar PV module for generation of electricity when mounted on a solar tracker is disclosed. It comprises two types of PV cells, one cell type having a narrower bandgap and thus higher sensitivity to longer wavelengths of sunlight, the other having wider bandgap with higher sensitivity to shorter wavelengths. Sunlight entering the module is spectrally separated by diffraction into shorter and longer wave bands which are directed preferentially toward to the wider and narrower bandgap cells respectively. The two cell types are arrayed on a receiving plane in alternating strips, laterally-separated and oriented parallel to the single axis of tracking, if used. As explained more fully below, lenses are used to spectrally separate sunlight with alternating, mirrored orientations, so that longer wavelengths of sunlight are cross-directed toward the first type of cell having a narrower bandgap from two opposing directions, and shorter wavelengths of sunlight are also cross-directed toward the second type of cell having a wider bandgap from two opposing directions.

The optically transmitting entrance surface spaced in front of, and parallel to, the receiving plane is arrayed with transmission diffraction grating strip lenses that cover essentially the full area of the surface. Each diffracting strip lens has variably spaced surface structure (grooves) or variably spaced fringes of refractive index (Bragg planes) that extend down some depth from the surface, as in a variably spaced volume phase holographic (VPH) grating. The grooves or Bragg planes are configured asymmetrically, so as to direct light preferentially into one of the two directions of first order diffraction. The spacing and symmetry of the grooves or refractive index fringes is varied so that:

1) Sunlight at a chosen separation wavelength, $\lambda_s$, incident anywhere on the strip lens is diffracted in first order to a line focus at the receiving plane, and 2) The line focus formed by a diffracting strip lens at the separation wavelength is formed off-axis, at the edge of the wider bandgap cell strip, so that longer wavelength rays which are diffracted to larger angles than the separation wavelength are diffracted onto the adjacent narrower bandgap cell strip, while shorter wavelength rays which are deflected by smaller angles impinge on the wider bandgap cell strip.

The plurality of diffracting strip lenses are set out with alternating, mirrored orientations, such that the rays at wavelength $\lambda_s$ in each case cross over the wider bandgap cell strip beneath to focus on its far edge. Thus, for both diffracting strip lens orientations, the wider bandgap cell strips receive the diffracted rays of shorter wavelengths, and vice versa. This configuration we call "cross eyed strip lenses". With such lenses abutting across the entire entrance plane, all entering sunlight diffracted in first order is deflected according to wavelength to the more efficient cell strip, thus improving conversion efficiency.

The module is oriented either by a dual axis solar tracker so that an entering ray of sunlight is normal to the entrance surface, or by a single axis tracker so the entering rays lie in a plane that is perpendicular to the entrance surface and parallel to the cell and strip lenses.

Since first order diffraction is generally not highly efficient over the full solar spectrum, the diffractive strip lenses are tuned to have highest efficiency at a wavelength that varies according to position across the lens. Thus, in those regions of the diffractive strip lenses lying above the wide bandgap cell strip where directly transmitted sunlight (0th order diffraction) would pass through to that cell strip, the strip lens is tuned to have highest efficiency for diffraction at longer wavelengths $\lambda > \lambda_s$, which would not be converted by the wide bandgap cell. Conversely, in those regions of the diffractive strip lenses where directly transmitted light (0th order) would pass through to the narrow bandgap cell strip, the diffractive strip lens is tuned to have highest efficiency for first order diffraction at shorter wavelengths $\lambda < \lambda_s$, which are less efficiently converted by the narrow bandgap cells.

Thus in a module according to this invention, the direct sunlight entering the module is split by diffraction into long and short wavelength spectral bands which are directed largely to those cells which will convert them with higher efficiency. Because both the diffractive lenses and the cells have total area essentially that of the full module, the resulting module conversion efficiency for direct sunlight can be expected to be higher than for a module with its full area covered by either one of the two cells alone. At the same time, the conversion efficiency to diffuse light can be expected to be comparable to that for either single-cell module, given diffractive lenses with low back-scattering loss. Thus the combined sensitivity to the full input, direct and diffuse, can be expected to be higher than for a module with its full area covered by either one of the two cells types alone.

In accordance with the present invention, a solar PV module for generation of electricity when mounted on a single axis tracker, characterized in that a first type of PV cells are provided having a first wider bandgap, and a second type of PV cells are provided having a second narrower bandgap.

A receiving plane is provided with a plurality of strips of the first type of PV cells having a first wider bandgap, and having a plurality of strips of the second type of PV cells having a second narrower bandgap, where the strips of the first type of PV cells are laterally-separated and arrayed in alternating strips with the strips of the second type of PV cells, such that there are alternating strips of wider and narrower bandgap PV cells, where all of the strips are oriented parallel to the single axis of tracking.

A planar entrance surface spaced ahead of and parallel to the receiving plane, arrayed with linear transmission diffraction strip lenses covering essentially the full area of the entrance surface, the diffracting strip lenses configured in opposing pairs, each pair being associated with, parallel to and located above a first type of PV cells having a wider bandgap, in which sunlight is spectrally divided and cross-directed preferentially toward the first type of PV cells and the second type of PV cells, respectively.

The diffracting strip lens in each paired strip lens is constructed with variable pitch, such that light at a single separation wavelength $\lambda_s$, on entering the first side of a strip lens is diffracted in first (+1) order to cross over a first edge of a strip of the first type of PV cells below to focus in a line along a second edge of said strip of the first type of PV cells, and light at the single separation wavelength $\lambda_s$, on entering the second side of a strip lens is diffracted in first (−1) order to cross over the second edge of said strip of the first type of PV cells below to focus in a line along the first edge of said strip of the first type of PV cells, an arrangement called a "cross eyed strip lens."

Wherein the module thus constructed with cross-eyed strip lenses and alternating strips of first and second types of PV cells has the desired property that shorter wavelengths $\lambda < \lambda_s$ are cross-diffracted onto strips of the first type of PV cells having a wider bandgap, while longer wavelengths $\lambda < \lambda_s$ are diffracted onto intervening strips of the second type of PV cells having a narrower bandgap.

In accordance with the present invention, a solar PV module is disclosed having two types of laterally-separated coplanar cells with different bandgaps to improve conversion efficiency. Sunlight with wavelengths shorter than a separation wavelength $\lambda_s$ is directed largely to the first type of wider bandgap cells. Sunlight with wavelengths longer than a separation wavelength $\lambda_s$ is directed largely to the second type of narrower bandgap cells. The separation wavelength is chosen so that each cell is illuminated largely by that part of the solar spectrum to which it has the higher conversion efficiency, resulting in an overall conversion efficiency higher than for either type of cell used alone. The wider bandgap cells are configured on a planar support in separated parallel strips, with the narrower bandgap cells largely filling the area between these strips. The module is oriented toward the sun by a tracker, so sunlight enters the module either perpendicular to the entrance window or in a plane perpendicular to the entrance window and parallel to the strips. Separation of the sunlight spectrum is accomplished by transmission through diffracting strip lenses arrayed on a planar entrance surface spaced above the cell plane. Each strip lens has diffracting grooves or refractive index modulations variably spaced so as to act as an off-axis lens at the separation wavelength $\lambda s$, so that sunlight diffracted in first order at this wavelength comes to an off-axis line focus. The diffractive strip lenses have two opposite orientations configured so that wavelengths $\lambda < \lambda s$ are, for both orientations, diffracted in first order (plus 1 and minus 1 according to orientation) across to the left and right respectively and away from the wider bandgap cell strips, while shorter wavelengths $\lambda < \lambda s$ are diffracted onto the wider bandgap cell strips.

DETAILED DESCRIPTION

Figure 1:
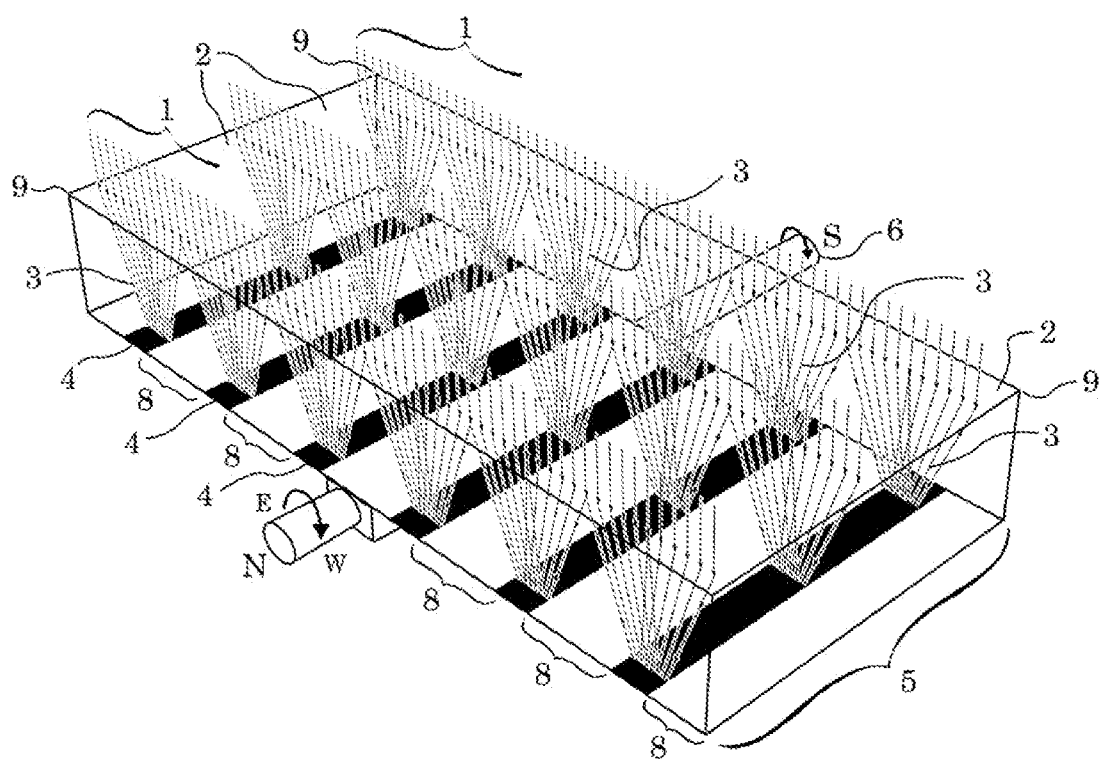
FIG. 1 is a perspective view of a module according to various embodiments of the disclosure, showing the paths of shorter wavelength solar rays.
Figure 2:
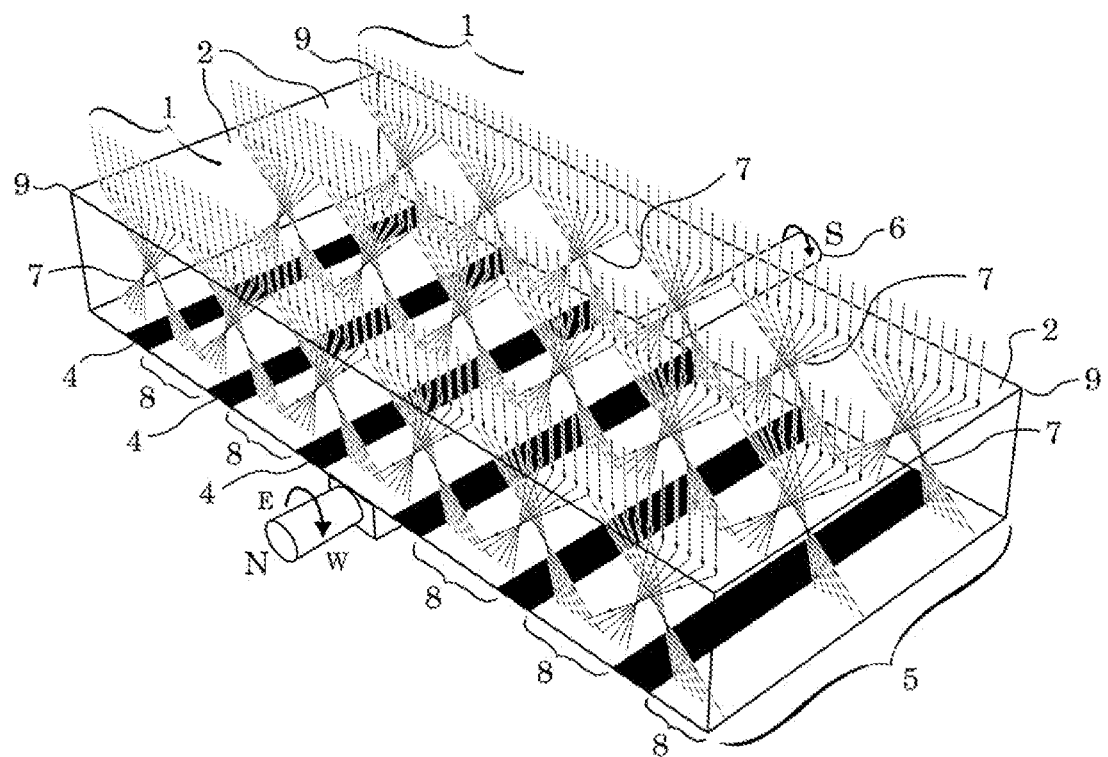
FIG. 2 is a perspective view of a module according to various embodiments of the disclosure, showing the paths of longer wavelength solar rays.

A high efficiency photovoltaic (PV) module is disclosed herein, aimed at achieving high conversion efficiency using spectral separation of sunlight to take advantage of two different PV cell types, with different bandgaps. A key feature of this invention is in the optics used to achieve lateral separation of sunlight into two sharply defined spectral bands, one with light wavelengths mostly less than the separation wavelength $\lambda s$, and the other with light wavelengths mostly greater than $\lambda s$. FIG. 1 and FIG. 2 illustrative the principles of the invention. The two figures show the same module, the only difference being in the paths taken by rays of sunlight in different spectral bands.

FIG. 1 shows parallel rays of sunlight 1 comprising many different wavelengths entering a module through a planar diffractive window 2. Diffracted rays 3 shown in FIG. 1 are of shorter wavelength than the separation wavelength $\lambda s$ and are diffracted at smaller angles to impinge on parallel strips 4 of a first type of PV cells made from semiconductor with wider bandgap, set out in a plane 5 parallel to the diffractive entrance window 2. The module is oriented so that the cell strips 4 lie in the North-South (N-S) direction. The module is turned during the day about a N-S axis 6 to track the movement of the sun so that the sun's rays always enter the module perpendicular to the module edges 9.

FIG. 2 shows parallel rays of sunlight 1 comprising many different wavelengths entering a module through a planar diffractive window 2. But here the diffracted rays 7 shown are of longer wavelength than the separation wavelength $\lambda s$ and are diffracted at larger angles, crossing over the strips 4 of the first type of PV cells to impinge on parallel strips 8 of a second type of PV cells made from a different semiconductor with narrower bandgap. These strips 8 of a second type of PV cells are also set out in said plane 5 parallel to the diffractive entrance window 2, and fill the space between said strips 4 of the first type of PV cells.

For clarity, FIG. 1 and FIG. 2 illustrate modules which are drawn with only a few strips of the two different first and second PV cell types, and relatively large spacing between the diffracting and cell planes. It will be understood by those familiar with the art that in practice it may be more economical to make a module with many closely spaced strips and close spacing between the diffracting and cell planes.

The laterally separated first and second types of cells of different bandgaps of this invention may be of quite different semiconductor types. Their electrical connections may be separate, and there is no requirement for current or lattice matching, as is the case for tandem cells stacked vertically, rather than laterally separated as in this invention. The module may use combinations of cell types chosen for their low cost and high efficiency rather than to meet matching requirements.

Figure 3:
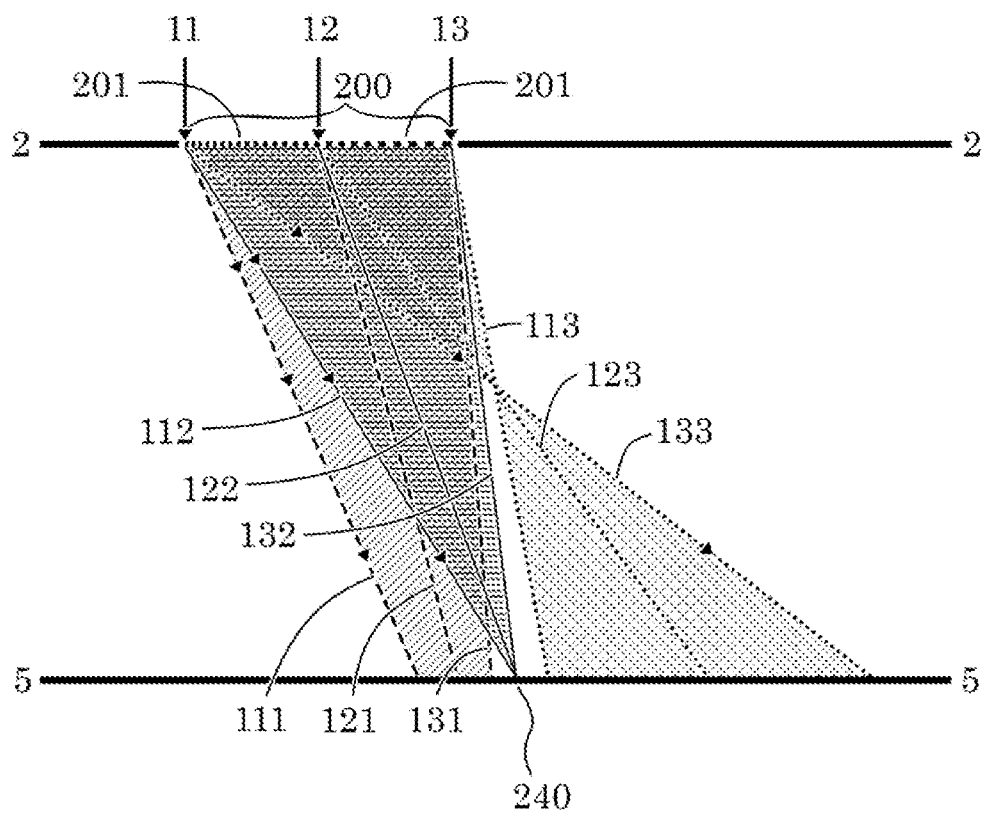
FIG. 3 is a diagram of a single diffractive strip lens separating incoming sunlight of three different wavelengths.

The principle according to various embodiments for making the sharp separation of light at wavelengths above and below the separation wavelength may be understood with reference to FIG. 3. The planar diffractive window 2 is formed by diffractive strip lenses in alternating strips, with a single strip lens 200 shown in the figure. The strip lens 200 comprises a planar diffraction grating with grooves or refractive index variations 201 that are straight and perpendicular to the plane of the paper. The property of the strip lens 200 is that sunlight rays at wavelength λs entering across the strip and diffracted in first order are brought to a linear focus 240 in the cell plane 5. This focusing property is achieved by varying the spacing of the grooves 201 of the strip lens 200, as shown in FIG. 3 by the variable spacing of the points across the width of the strip.

The passage of rays of sunlight of wavelengths longer and shorter than the separation wavelength is shown by the three rays of sunlight 11, 12 and 13 entering perpendicular to the lens plane 2 at the edges and center of the strip lens 200. On passing through the lens, the single white light ray is diffracted into different directions, depending on wavelength and position on the lens. In FIG. 3, we show the paths taken by three different wavelengths. Rays 112, 122 and 132 show the paths taken by rays of wavelength λs, which all impinge on the cell plane 5 along the line focus 240. Rays 111, 121 and 131 show the paths taken by rays of wavelength shorter than λs, which are diffracted at smaller angles, all impinging on the cell plane 5 to the left of the line focus 240. Rays 113, 123 and 133 show the paths taken by rays of wavelength longer than λs, which are diffracted at larger angles, all impinging on the cell plane 5 to the right of the line focus 240.

It will be apparent to those familiar with the art that the diffracting strip lenses might take the form of grooves on the surface of a transparent material, or periodic variations in refractive index (Bragg planes) in a transparent material forming a volume phase grating. In what follows the word grooves should be interpreted as meaning any periodic fluctuation that causes diffraction. The period is not everywhere the same, but changes monotonically across the strip lens 200, as shown in FIG. 3 by the changing spacing 201.

Figure 4:
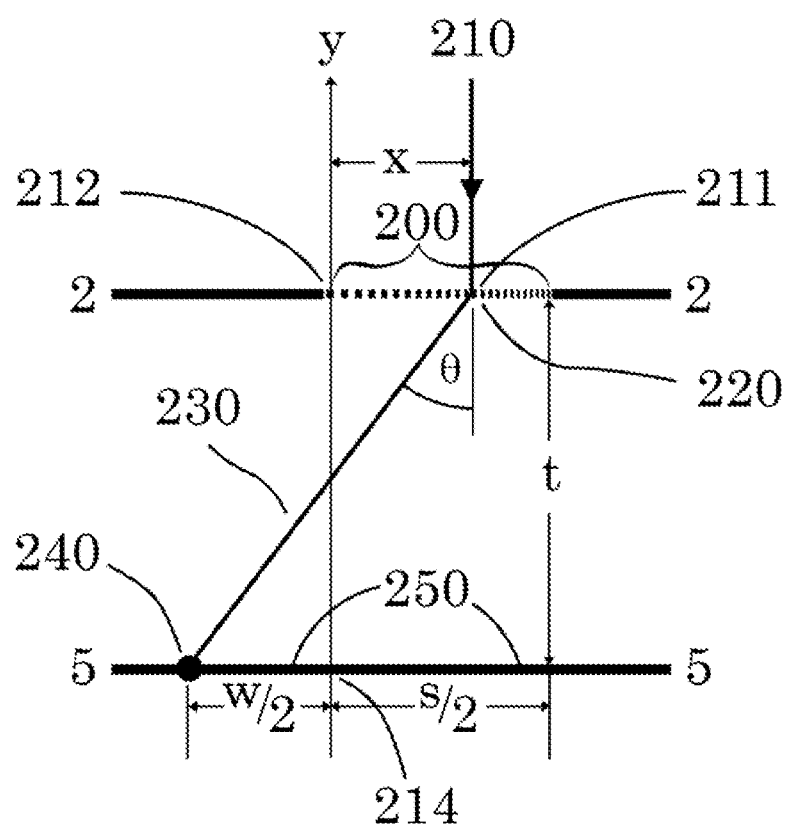
FIG. 4 illustrates the diffraction of a single ray of light of given wavelength passing through the diffractive lens.

The algebraic function describing the groove spacing or grating period is derived with reference to FIG. 4, which is dimensioned for a module in which the wider bandgap cell strips 4 have a width w and are spaced apart by a distance s. A single light ray 210 is shown entering the diffraction strip lens 200 at normal incidence at a point 211 at distance x from the left hand edge 212 of the strip lens 200. The groove spacing or grating period g(x) is variable, and is selected such that a light ray 210 of the separation wavelength λs, entering the strip lens 200 at normal incidence at any distance x from 0 to s/2 measured across the strip lens 200 from point 212 will be diffracted in first order to line focus 240. The width of the strip lens 200 is s/2. The focus 240 is a line perpendicular to the paper lying in the plane 5 at distance y=−t below the diffractive lens and displaced a distance x=−w/2, from the reference point 214 on the y axis. The optical path from the strip lens 200 to the focus is taken to be through a transparent medium, for example air or glass, of refractive index $n_3$.

The groove spacing or grating period (as measured across the entrance surface) as a function of distance x across the strip lens required to produce a line focus may be determined as follows. From the geometry as shown in FIG. 4, the angle of diffraction θ to direct a ray 230 from point 220 at x to the focus 240 is given by $$\theta = \arctan(x+w/2)/t \quad (1)$$

For diffraction in the first order, the required groove spacing g(x) is related to wavelength λ and diffraction angle θ by the relation $$\lambda = n_3 g(x) \sin \theta \quad (2)$$

It follows that the groove spacing g must be varied with x by the relation $$g(x) = \lambda_s/n_3 [1+t^2/(x+w/2)^2]^{1/2} \quad (3)$$

where $\lambda_s$ is the separation wavelength.

For volume phase gratings illuminated at normal incidence, the spacing between Bragg planes intersecting the entrance plane 2 is given by g(x), and the slant angle α of the Bragg planes is given by $$\alpha = \frac{1}{2} \arcsin[n_3/n_2 \sin \theta(\lambda_b)] \quad (4)$$

where $\lambda_b$ is the wavelength of peak diffraction efficiency and $n_2$ is the average refractive index of the volume phase grating material.

Equations 3 and 4 are used to design the diffractive strip lenses in the embodiments described below.

Figure 5:
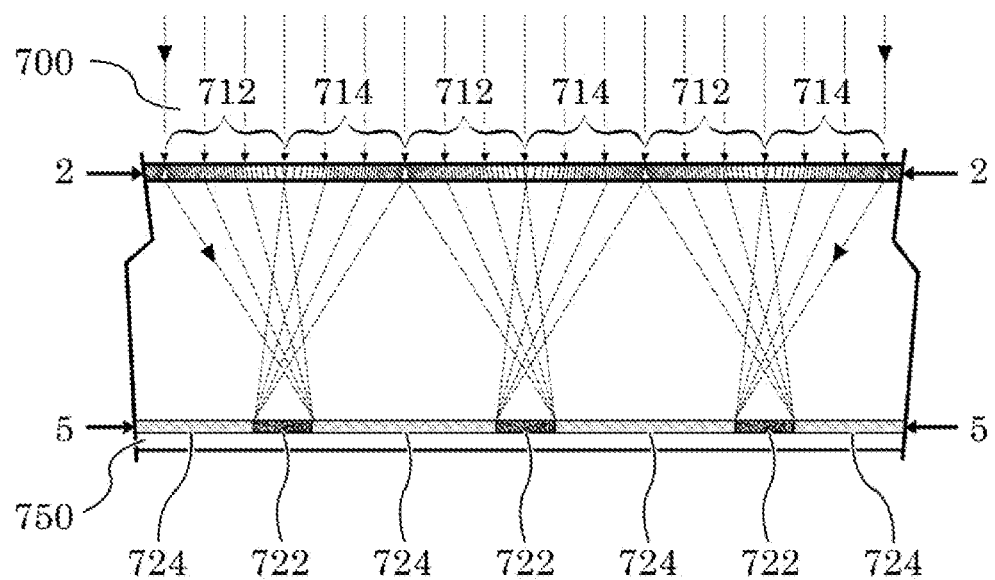
FIG. 5 illustrates a cross-section view of a PV module according to various embodiments of the disclosure, showing the paths of rays at the separation wavelength.

Referring to FIG. 5, a cross-section view of a PV system 700 is illustrated according to various embodiments. This shows how mirror-image strip lenses 712 and 714 are replicated with first order diffraction angles alternating to the left and to the right, +1 and −1 order, so as to concentrate the longer and shorter wavelength bands onto the two different PV cell types. The system 700 comprises a planar entrance surface 2 with a plurality of diffracting strip lenses of the type 200 described previously. Those marked 712 are oriented in a first direction to diffract in the −1 order, the same as the strip lenses 200 in FIG. 3. The plurality of strip lenses 714 are oriented in a second direction to diffract in the +1 order, the mirror image of FIG. 3. The strip lenses 712, 714 may cover substantially all of the planar entrance surface 2. Each strip lens 712, 714 may have grooves or Bragg planes variably spaced so as to act as an-off-axis, linear lens, diffracting sunlight in first order at the separation wavelength λs to a line focus at a receiving plane 5. The dashed lines in FIG. 5 show the diffracted rays at just the separation wavelength. The planar entrance surface 2 is spaced ahead of and parallel to the receiving plane 5, and the space between the strip lenses 712 and 714 and the PV cell strips 722 and 724 may be filled with any transparent material of refractive index $n_3$, or by vacuum.

The receiving plane 5 comprises a plurality of a first type of PV cells having a wider bandgap 722 and a plurality of a second type of PV cells having a narrower bandgap 724. In various embodiments, the narrower bandgap PV cells 724 may comprise silicon. The first type of wider bandgap PV cells 722 may be arrayed in parallel, coplanar strips, with each strip having two edges, and the second type of narrower bandgap PV cells 724 may fill the remaining area of the receiving plane 5 between the first type of higher bandgap PV cells 722. It will be apparent to those skilled in the art that the narrower bandgap cells 724 may be placed at a level below that of the wider bandgap cells, and thus might be implemented not as strips, but as a large cell (for example of silicon) with strips of the wider bandgap cells located above.

The diffracting strip lenses 712 oriented in the first direction focus light at the separation wavelength λs to a first edge of the first type of wider bandgap PV cell strips 722 while the strip lenses 714 oriented in the second direction focus light at the separation wavelength λs to a second edge of the first type of wider bandgap PV cell strips 722. The diffracting strip lenses 712 and the diffracting strip lenses 714 alternate, such that, for both the diffracting strip lenses 712 and 714, wavelengths longer than the separation wavelength $\lambda s$ are diffracted onto the second type of narrower bandgap PV cell strips 724, while wavelengths shorter than the separation wavelength $\lambda s$ are diffracted onto the first type of wider bandgap PV cell strips 722.

The system of dispersing optics and cells may be mounted on a supporting plate 750. A dual axis tracker may be used to orient the system such that plane of the gratings is held perpendicular to the sun. Alternatively, a single axis tracker may be used, in which case the unit is oriented such that the sunlight is held in a plane which is both perpendicular to the planar entrance surface and parallel to the grating grooves.

Figure 6:
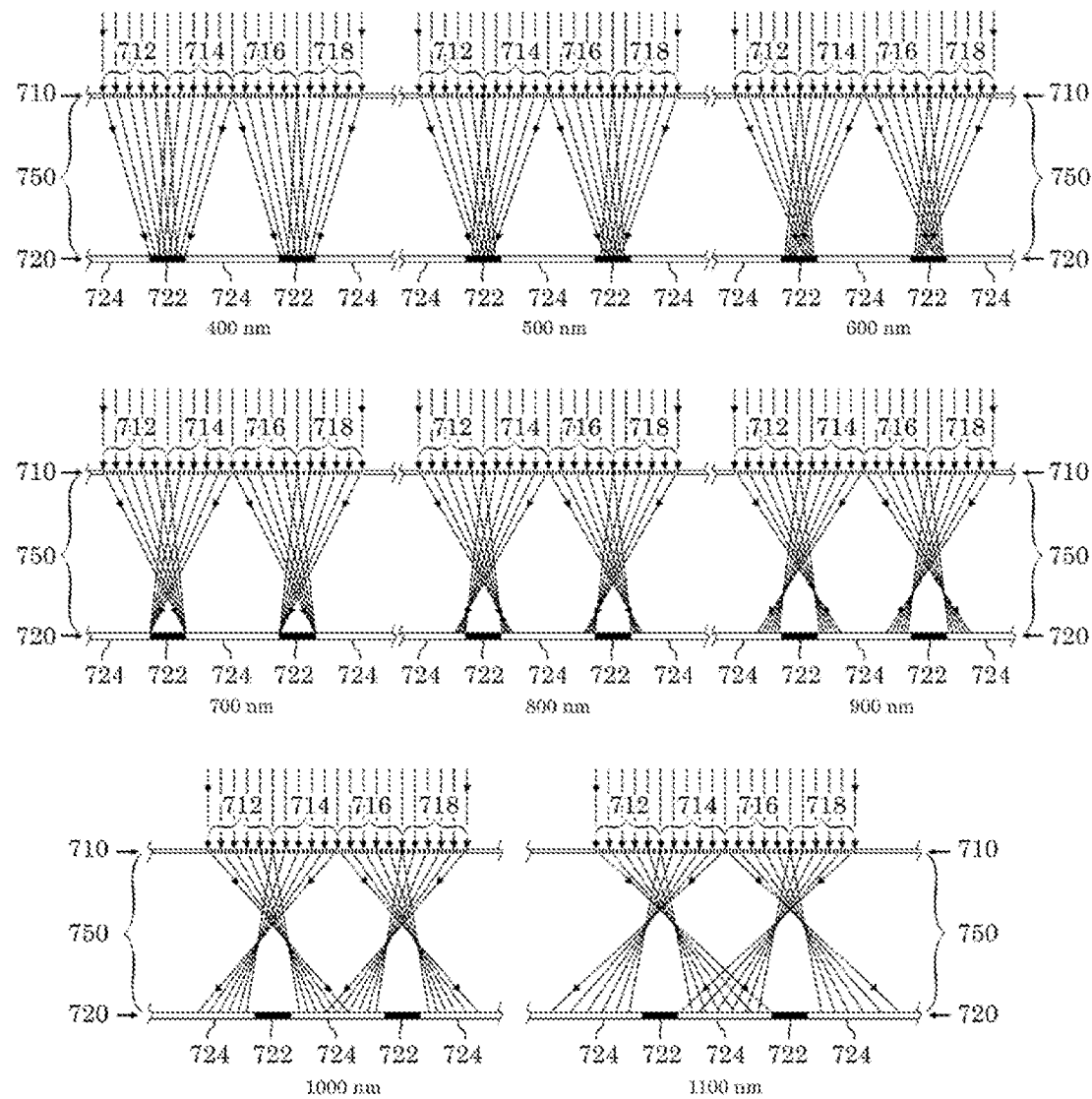
FIG. 6 illustrates the paths of sunlight rays shown separately for 8 different wavelengths, as diffracted by multiple strip lenses.

The action of the diffracting surfaces over a broad range of wavelengths is shown in FIG. 6. A PV module comprising a plurality of diffractive strip lenses is illustrated according to various embodiments. As shown in FIG. 6, each diffractive strip lens is similar to that described with reference to FIG. 3. Adjacent strip lenses are oriented in opposite orientations. For example, a first strip lens 712 diffracts light to the right. A second strip lens 714 which is adjacent to the first strip lens 712 diffracts light to the left. Similarly, a third strip lens 716 which is adjacent to the second strip lens 714 diffracts light to the right, and a fourth strip lens 718 which is adjacent to the third strip lens 716 diffracts light to the left. Any number of alternating strip lenses may be used. In various embodiments, a single diffractive surface may be used, in which one compound lens may combine strip lenses with alternate diffractive directions.

FIG. 6 shows in different drawings the paths of rays of different wavelength, in a system designed for a separation wavelength $\lambda s$ equal to 700 nm. The variable groove spacing for this system was calculated using equation 3 above with $\lambda s = 700$ nm. The drawing for $\lambda = 700$ nm shows the rays at this wavelength diffracted to cross over and form two line foci which define the boundaries of a wider bandgap cell strip 722. Deflection angles $\theta$ for wavelengths $\lambda$ other than $\lambda s$ were calculated using equation 2. The shorter wavelength light at wavelengths 400 nm, 500 nm, 600 nm, as diffracted in first order, are seen to converge to the regions 722 between adjacent diffractive strip lenses. A wider bandgap PV cell which is efficient at shorter wavelengths is located in the region 722 between the line foci of the third strip lens 716 and the fourth strip lens 718. For the geometry shown, wavelengths between 400 and 700 nm are diffracted in first order to the region where the wide bandgap cell is located.

Diffraction of the longer wavelength light at wavelengths 800 nm, 900 nm, 1000 nm and 1100 nm is shown also in FIG. 6. The wavelengths longer than the separation wavelength are diffracted in first order by the first strip lens 712 and the fourth strip lens 718 to overlap and fall in the region 724 between the line foci formed at $\lambda s$ by the first strip lens 712 and the fourth strip lens 718. Thus, a PV cell which is more efficient at longer wavelengths (also referred to as a narrow or narrower bandgap cell), such as a silicon cell may be placed in this region and receive long wavelength light from both the first strip lens 712 and the fourth strip lens 718. For the geometry shown, all wavelengths between 700 nm and 1100 nm are diffracted in 1st order to the region 724 where the narrow bandgap cell is located.

It will be apparent to those familiar with the art that the wavelengths chosen for these examples are only given as an example suitable for PV cells for which the separation wavelength is 700 nm.

To optimize the efficiency advantage of this invention, the choice of spectral separation wavelength will be made to best match the performance of the wider bandgap cells used in the system. This may be understood with reference to FIG. 7, which includes a graph of spectral efficiency versus wavelength of two representative cells used in a system. Response line 110 shows the efficiency of conversion of light energy to electrical energy for a representative wide bandgap photovoltaic cell. The cell's efficiency is high at shorter wavelengths, but falls sharply to zero for wavelengths longer than $\lambda_s$, which corresponds to a photon energy at the cell's bandgap energy. Response line 120 shows the efficiency for a narrow bandgap PV cell such as silicon. The shape of the response is similar, but the peak response is shifted to longer wavelengths, because of the narrower bandgap. The narrow bandgap PV cell has a higher spectral efficiency at wavelengths longer than $\lambda_s$, while at wavelengths shorter than $\lambda_s$ the wide bandgap cell has greater spectral efficiency. Curve 130 shows the spectral distribution of sunlight under typical conditions (AM 1.5). In various embodiments, sunlight of wavelengths longer than $\lambda_s$ is directed for conversion by a narrow bandgap cell, and light of wavelengths shorter than $\lambda_s$ to a wide bandgap cell, to increase overall efficiency. It is a feature of this invention that the overall efficiency is maximized by sharply defining the separation at a wavelength close to $\lambda_s$. If this is not done, energy at wavelengths longer than $\lambda_s$ that reaches the wide bandgap cell is effectively lost, while energy at shorter wavelengths reaching the narrow bandgap cell is converted with less efficiency that would have been realized if it had reached the wide bandgap cell. Those skilled in the art will recognize that the disclosed principles may be used to improve the performance of any paired PV cells having high but different spectral efficiencies. For different cells, the optimization will be at different wavelengths.

Grating Blaze and Directly Transmitted Light.

Up to this point we have considered only the light diffracted into the single order, and the spectral separation of sunlight diffracted in this order. The first order diffraction we want is in to the left or right (plus or minus 1 order) depending on whether the off-axis line focus is to be to the left of the right. In practice, while a large fraction of the light may be diffracted into the + or −1 order, some fraction of the light at any given wavelength may pass straight un-diffracted through a strip lens (zero order diffraction), or be diffracted in second order in other direction, depending on the details of the manufacture of the grating, independent of groove separation. These details of manufacture in general may be chosen to maximize the diffraction efficiency into the + or −1 order at a particular wavelength. For volume phase gratings, efficiency peaks at the wavelength that matches the Bragg condition. For surface relief diffraction by grooves, this wavelength for peak efficiency is called the blaze wavelength. In what follows, we will refer to the wavelength of maximum diffraction efficiency in first order as the blaze wavelength, for both grooved and volume phase gratings.

To optimize the conversion efficiency of this invention, the blaze wavelength as well as the groove spacing is preferably varied across the diffractive strip lens. For those portions of the entrance plane 2 where the un-diffracted light rays (zero order) pass through directly to the wider bandgap PV cells, it will be advantageous to choose the blaze wavelength to be longer than the separation wavelength $\lambda s$. Over the remaining entrance surface, for which directly transmitted red light will pass through to the narrower bandgap cells, the blaze wavelength is preferably chosen to be shorter than $\lambda s$, so shorter wavelengths will be efficiently directed by first order diffraction to the wider bandgap cells.

Optimization for High Efficiency to Diffuse Light.

Diffuse illumination enters the device at all angles of incidence and is thus not spectrally separated like direct sunlight. According to various embodiments, diffuse light is most efficiently converted by use of diffractive strip lenses that efficiently transmit light rays that are not in the plane of diffraction, i.e. they have low back-scatter and low absorption. Also according to various embodiments, to maximize diffuse light conversion, the PV cells together extend across essentially the full area of the module.

Choice of Grating Type

Gratings used for the diffractive strip lenses described with reference to FIGS. 1, 2, 3, 4, 5 and 6 either have grooves as surface features, or may be volume phase holographic gratings (VPH). The grooves of a conventional surface grating are, in VPH gratings, replaced by modulation of refractive index that extends in three dimensions, the grating having thickness below the surface. Diffraction in this case is analogous to Bragg x-ray diffraction in crystals. The spacing between adjacent layers of high index across a diffractive lens made as VPH will be in practice nearly equal to the groove spacing g(x) in equations 2, 3 and 4 above. VPH gratings may be made very efficient at diffracting in either the +1 or the −1 order over a range of wavelengths, by slanting the layers to the right or the left so that Bragg reflection favors the direction of the diffracted wavelength for which the highest efficiency is required.

VPH gratings can readily be made with variable grating period as needed to obtain the line focus. The efficiency for first order diffraction for any given period depends on wavelength, amplitude of index modulation and Bragg plane slant angle and thickness or depth. The efficiency of diffraction into first order can be maximized and that into second order reduced, with benefit in this application, by making the index modulation close to sinusoidal. The spectral bandwidth can be increased by changing slant angle and refractive index modulation through the grating thickness.

Another advantage of VPH gratings over surface groove gratings is that back-scatter is generally less, and thus the transmission of the diffuse component is higher. VPH gratings may be manufactured with low cost, scalable methods.

Embodiment 1; Module with an Air Gap and Separation Wavelength $\lambda_s$=700 nm Here we provide a specific design for a module optimized specifically for a separation wavelength of 700 nm and an air gap between the diffracting plane and the cell plane. The grating period depends only on angles, and will be the same for the same geometry at different scales. Referring to FIG. 5, we take the air gap between the diffracting plane 2 and the cell plane 5 to be 90 mm, the wider bandgap cell strip 722 to have width 25 mm and the narrower bandgap cells 724 to have width 55 mm. Table 1 gives the diffraction strip lens properties as a function of x given in column 1, the distance from the boundary of strip lenses 712 and 714 in FIG. 5.

TABLE 1

Diffraction strip lens design for air gap module.

| 1<br>x<br>(mm) | 2<br>g(x)<br>(μm) | 3<br>$\theta_s$<br>degrees | 4<br>λ(blaze)<br>nm | 5<br>θ(blaze)<br>degrees | 6<br>Bragg plane<br>slant angle |
|---|---|---|---|---|---|
| 0 | 5.09 | 7.9 | 900 | 10.2 | 3.3 |
| 5 | 3.67 | 11.0 | 900 | 14.2 | 4.6 |
| 10 | 2.89 | 14.0 | 900 | 18.2 | 5.8 |
| 15 | 2.40 | 17.0 | 550 | 13.3 | 4.3 |
| 20 | 2.06 | 19.9 | 550 | 15.5 | 5.0 |
| 25 | 1.82 | 22.6 | 550 | 17.6 | 5.6 |
| 30 | 1.64 | 25.3 | 550 | 19.6 | 6.3 |
| 35 | 1.50 | 27.8 | 550 | 21.5 | 6.8 |
| 40 | 1.39 | 30.3 | 550 | 23.3 | 7.4 |

Column 2 lists in micrometers the groove spacing or index modulation period g(x) where g(x) is as shown in FIG. 4, and is calculated according to equation 3 for a separation wavelength $\lambda_s$=700 nm. Column 3 of Table 1 lists the angles in degrees of the diffracted rays at 700 nm wavelength resulting from the diffraction strip lens defined in this way, from equation 1. These groove spacings result in all the rays at 700 nm wavelength diffracted in first order being brought to the line focus at the cell strip edge.

Column 4 gives the wavelength chosen for peak diffraction efficiency in the first order, and column 5 the corresponding blaze angle. For x values below 1.25 mm, where entering rays are above the wider bandgap cell strip, the blaze angle is chosen to maximize the diffraction efficiency at blaze wavelength 900 nm, to direct wavelengths longer than the separation wavelength away from this strip and onto the narrower bandgap cells. For x values greater than 1.25, where entering rays are above the narrower bandgap cells, the blaze angle is chosen to maximize efficiency for diffracting wavelength 550 nm onto the wider bandgap cells, whose conversion efficiency is higher. Column 6 of Table 1 gives the slant angles α as a function of x needed to obtain the desired blaze wavelengths for a diffraction strip lens made as a volume phase grating of average index of refraction n=1.52.

Figure 8:
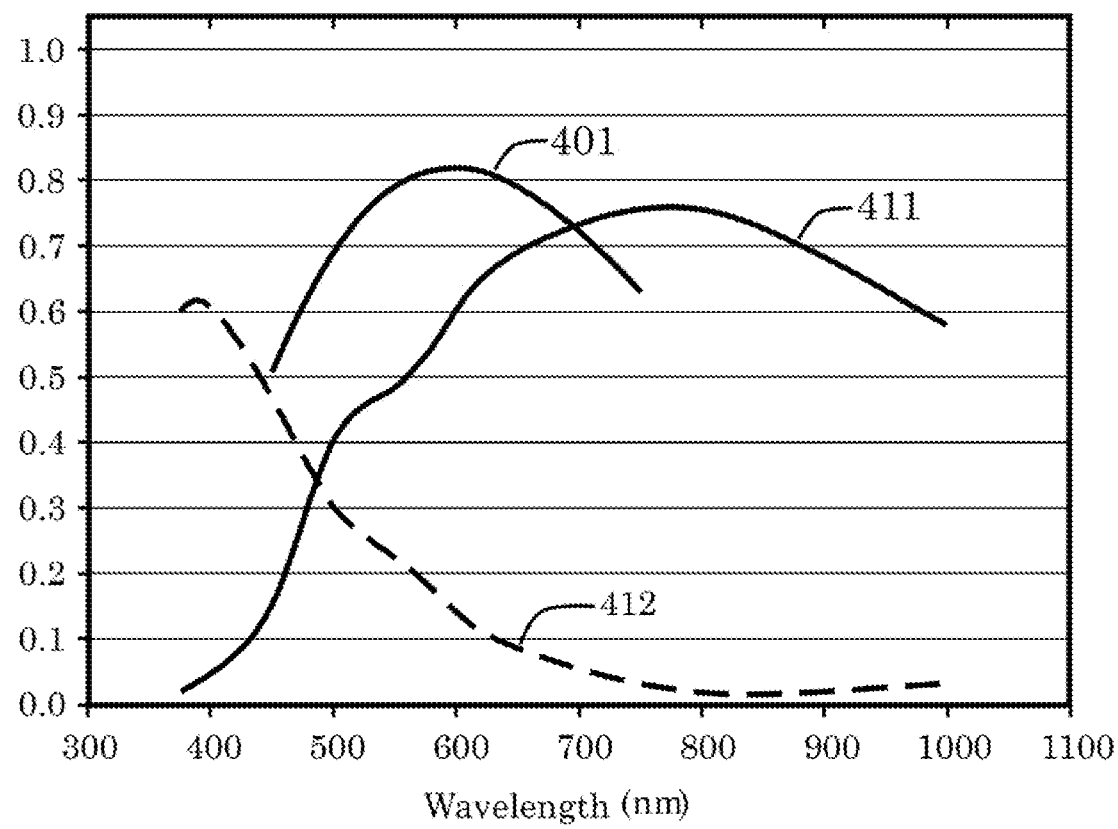
FIG. 8 illustrates diffraction efficiency as a function of wavelength and diffraction order for two different volume phase transmission diffraction gratings.

The range of groove spacings and wavelengths for peak efficiency in first order diffraction for the design of this embodiment are well matched to what has been demonstrated in VPH grating manufacture. As an example, FIG. 8 shows in curve 401 the efficiency of diffraction into first order of a commercial volume phase grating made by Wasatch Photonics (wasatchphotonics.com). This grating has a fixed Bragg plane spacing g of 1.67 micrometers, and is designed for peak efficiency in first order at 600 nm wavelength. The spacing is very close to that listed for this embodiment in Table 1 for x=3 mm. The efficiency curve shows 82% of the incident light is diffracted into first order at 600 nm. The efficiency remains above 70% from 510 to 710 nm, and above 60% from 470 to 760 nm. Most of the light that is not in the first order is not diffracted at all and passes through without deviation (0th order diffraction).

FIG. 8 shows also in curve 411 the measured efficiency of diffraction into first order of another VPH grating made with fixed spacing g=3.33 micrometers, as reported by Barden el al, PASP 112, pp 809-820, 2000. The characteristics of this grating are close to the desired properties of the diffractive strip lens of this embodiment at x=0.5 mm, as shown in Table 1 (3.67 micrometer spacing). The efficiency of diffraction in first order for this grating is 70% or greater from 700 to 900 nm, with a peak of 75% at 800 nm, and is above 60% at 1000 nm. This particular grating does show in curve 412 significant diffraction of blue light into second order, 30% at 500 nm. This would be diffracted in the same direction as the 1000 nm light, i.e. toward the narrow bandgap cell. However, for the diffractive strip lens optimized specifically for our application, this order may be reduced by design optimization, for example by making the refractive index modulation close to sinusoidal.

Effect of Non-Normal Illumination on Spectral Separation for Embodiment 1.

Performance will depend on the type of solar tracker used to orient a module according to this invention. For the highest output through a day, the module may be mounted on a dual axis tracker, so that the entrance window plane 2 may be held perpendicular to the sunlight at all times. The analysis given so far for this embodiment is for the case of illumination by collimated light, i.e. all rays parallel, at normal incidence on the entrance window. In practice, because of the finite angular size of the sun, even if the module is ideally oriented perpendicular to the sun, the diffractive separation will not be perfectly sharp.

Figure 9:
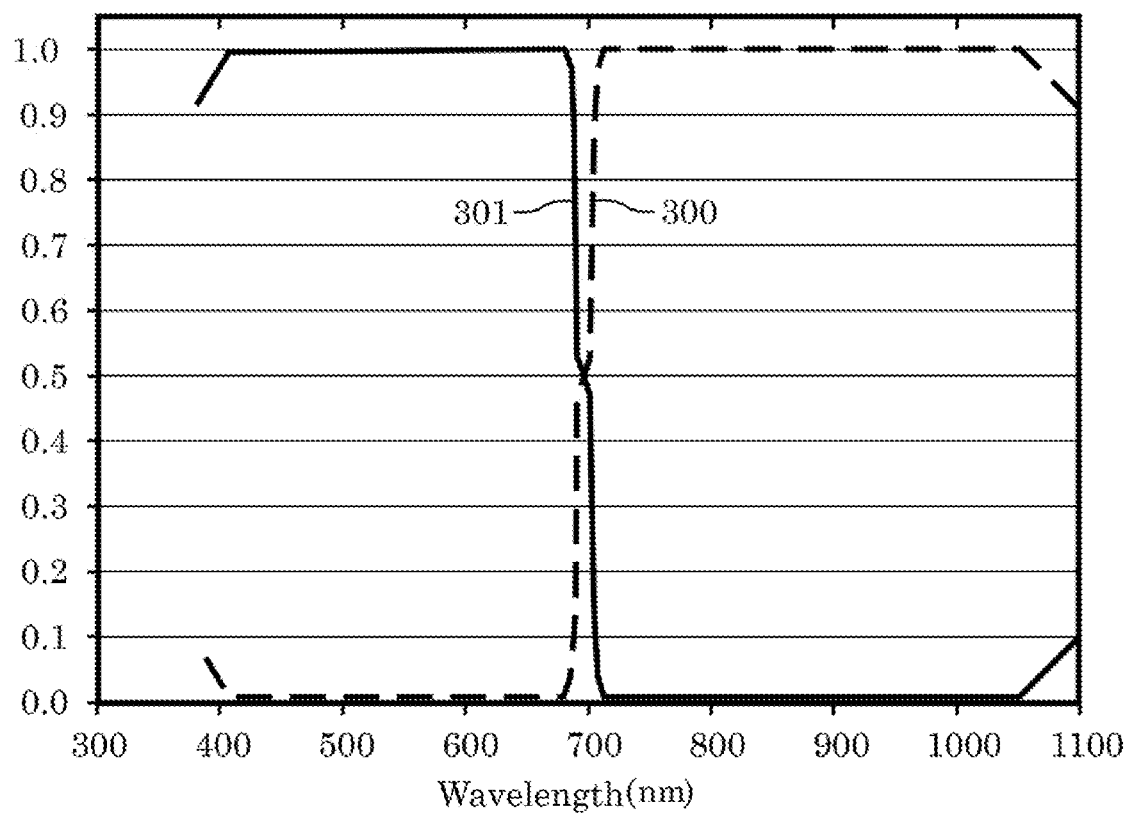
FIG. 9 shows the separation of wavelengths by first order diffraction for the sun at normal incidence for embodiments with air gap.

FIG. 9 shows the spectral separation realized for embodiment 1 by first order diffraction alone for the lower bandgap (300) and higher bandgap (301) cell strips, when the angular extent of the sun is taken into account. It is further assumed that the direction to the center of the sun's disc is normal to the device entrance window, and thus that rays from the edge of the sun's disc, which is ½ degree in extent, lie at up to ¼ degree off-normal. The resulting spectral separation for first order diffracted rays is plotted for the range of wavelengths from 380 nm, near the shortest extent of the solar spectrum in the ultraviolet, to beyond 1100 nm in the infrared, where the conversion efficiency of silicon falls to zero. The effect of the finite angular size of the sun is that separation is not perfectly sharp at the 700 nm separation wavelength. The separation region extends from 680 to 720 nm.

Figure 10:
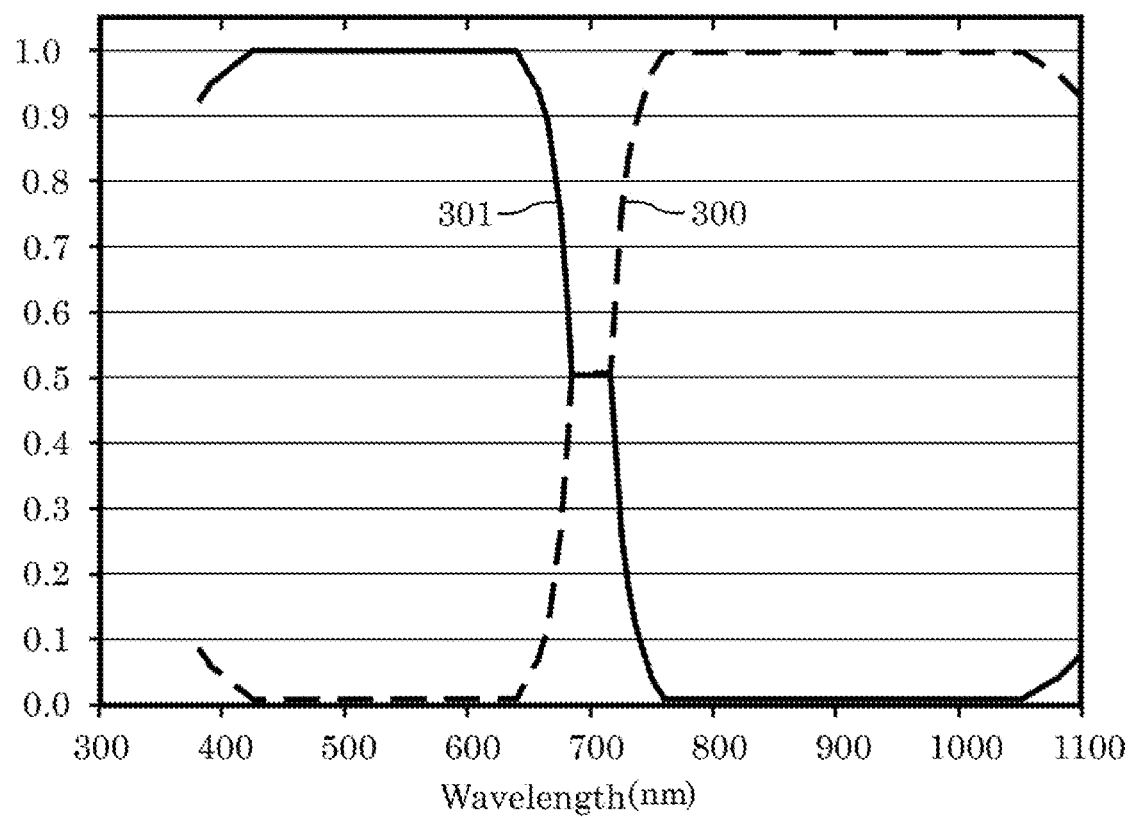
FIG. 10 shows the effect of ½° tracking error on separation of wavelengths by first order diffraction for embodiments with air gap.

FIG. 10 shows the added effect on first order diffraction if the dual axis tracker is not accurate, in the case that the module is pointed away from the center of the sun by ½ degree, in a direction about an axis parallel to the grating grooves, i.e. about the tracking axis when a single axis tracker is used. In this case, the line focus formed at the separation wavelength from half the strip lenses is displaced onto the wide bandgap cells, and the other half onto the narrow bandgap cells. As shown by the plots for the lower bandgap (300) and higher bandgap (301) cells, the separation region now extends from 635 to 765 nm.

Another type of misalignment will occur if the device is mounted on a single axis tracker whose rotation is about a horizontal axis in a North-South direction, as commonly used in large scale solar installations. The module is oriented so that the lens and cell strips 4 lie in the N-S direction, as illustrated in FIGS. 1 and 2. The module is turned during the day about a N-S axis 6 so that the sun's rays always enter the module perpendicular to the module edges 9. In this case, illumination by sunlight is in general not at normal incidence, but is rotated about the direction of the module edge 9 at a skew angle $\theta_i$ to normal. The sensitivity of the spectral separation is then much less than for the case of FIG. 10, but may still be significant for example in winter, when the sun's rays in the middle of the day will at a significant angle $\varphi$ from the normal to the grating grooves.

The effect of skew-angle illumination is calculated as follows. The condition for first order diffraction is $$\lambda = g[\sin(\theta i) + n_3 \sin(\theta)] \quad (5)$$

For illumination by light at angle $\varphi$ away from the normal in the perpendicular direction, the line focus at wavelength $\lambda s$ is formed closer to the diffraction plane (y=0) by a factor $$\sqrt{(1-\sin(\varphi^2/n_3^2))}. \quad (6)$$

When illuminated by wavelengths $\lambda$ other than $\lambda s$ the angle of first order diffraction $\theta$ is related to the angle of diffraction $\theta s$ at the separation wavelength $\lambda s$ by the relation $$\sin \theta = \lambda/\lambda_s \sin \theta_s \quad (7)$$

Thus the diffracted angle is increased for wavelengths longer than $\lambda s$ and decreased for wavelengths shorter than $\lambda s$.

Figure 11:
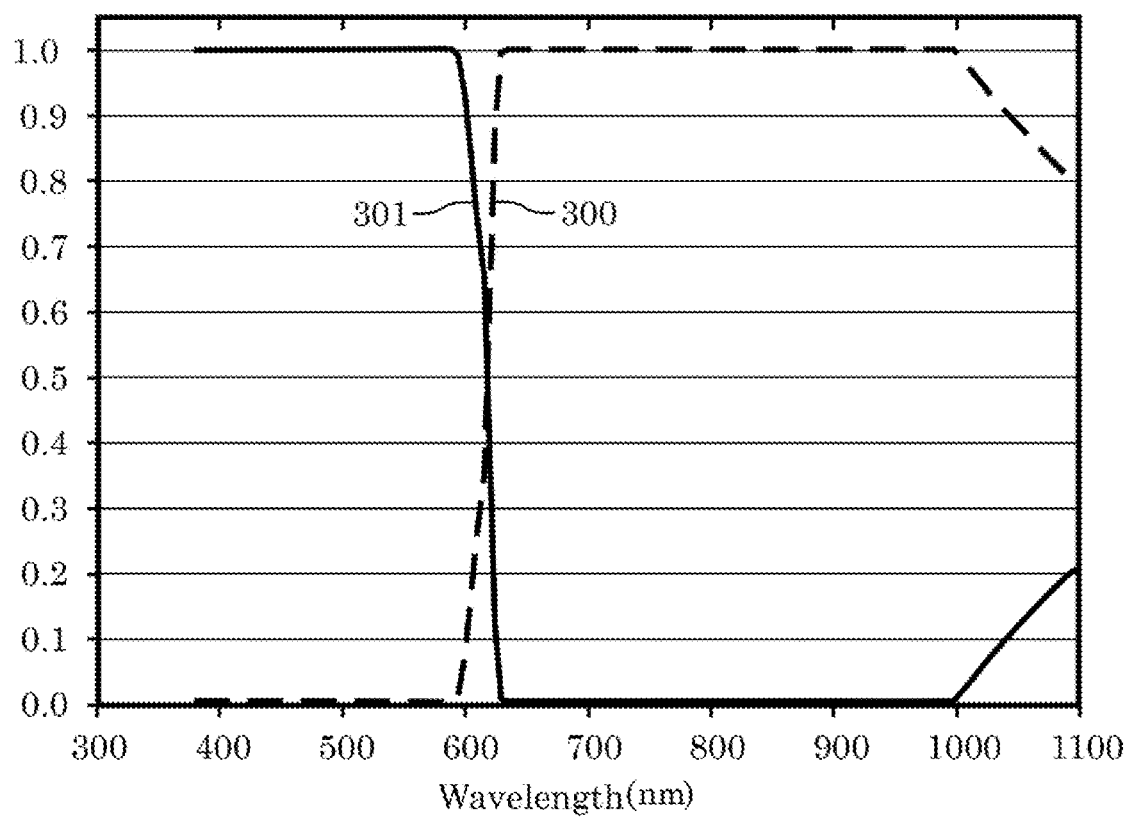
FIG. 11 illustrates the effect of 30° skew angle on spectral separation for embodiments with air gap

FIG. 11 shows the spectral separation obtained when $\varphi$=30 degrees, where again the plots are for the lower bandgap (300) and higher bandgap (301) cell strips. The separation is now shifted to a shorter wavelength of 615 nm. This shorter wavelength comes to a line focus at the boundaries of the cell strips. The separation remains sharp, because this shorter wavelength is now focused along the edges of the high bandgap strip. The effect of this shift in the separation wavelength will be to reduce somewhat the overall efficiency. The fraction of the spectrum from 615 to 700 nm that was directed to the wide bandgap cells is now directed to the narrow bandgap cells, where it will be converted with lower efficiency.

Embodiment 2, Implementation on Glass

In this embodiment, the invention is realized in a form similar to a conventional PV module: the cells are encapsulated on the back of a sheet of glass, and sunlight enters through the front of the sheet, to which are attached the diffracting strip lenses. This configuration is simple, is free from the dielectric reflection losses incurred by an air path, and has improved tolerance to skew-angle illumination, as shown below. It has the manufacturing disadvantage of requiring assembly of a large number of narrow cell strips, but this may be overcome by robotic assembly.

Figure 12:
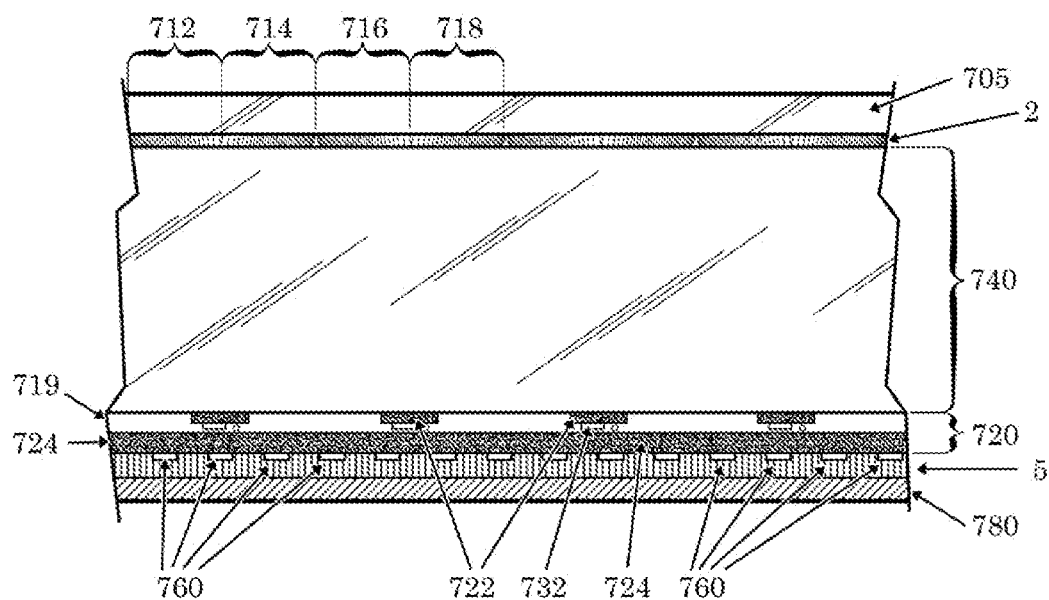
FIG. 12 shows a schematic cross section an embodiment of this invention on a sheet of glass

FIG. 12 shows a schematic cross section a second embodiment of this invention in which the sunlight light propagates through a sheet of glass, 740, between the diffractive lenses in plane 2 and PV cells 722 and 724 in the plane 5. The glass sheet 740 forms the structural support of the device, as in a conventional PV module. The strip lenses 712, 714, 716 and 718 are protected by a protective glass sheet 705. In one aspect, the strips 722 of wider bandgap cells are attached to the back of the glass plate 740, with the photovoltaic current carried by conductors 732 behind. A continuous narrower band gap cell 724 of material such as silicon is set behind the cell strips 722, with conductors 760, and attached by an optical coupling medium 719. Weather protection is provided as in conventional PV module by an encapsulant 770 and polymer 780.

TABLE 2

Diffraction strip lens design for embodiment 2

| 1<br>x<br>(mm) | 2<br>g(x)<br>(μm) | 3<br>θs<br>(degrees) | 4<br>λ(blaze)<br>(nm) | 5<br>θ(blaze)<br>(degrees) | 6<br>Bragg plane<br>slant angle<br>(degrees) |
|---|---|---|---|---|---|
| 0 | 3.71 | 7.1 | 900 | 9.2 | 4.5 |
| 0.25 | 2.80 | 9.5 | 900 | 12.2 | 6.0 |
| 0.5 | 2.26 | 11.8 | 900 | 15.2 | 7.5 |
| 0.75 | 1.90 | 14.0 | 900, | 18.2, | 8.9, 5.4 |
| 1.0 | 1.64 | 16.3 | 550 | 12.7 | 6.2 |
| 1.25 | 1.46 | 18.4 | 550 | 14.4 | 7.1 |
| 1.5 | 1.31 | 20.6 | 550 | 16.0 | 7.8 |
| 1.75 | 1.20 | 22.6 | 550 | 17.6 | 8.6 |
| 2.0 | 1.11 | 24.6 | 550 | 19.1 | 9.4 |
| 2.25 | 1.03 | 26.6 | 550 | 20.6 | 10.1 |
| 2.50 | 0.97 | 28.4 | 550 | 22.0 | 10.8 |

In one aspect of this embodiment, the glass is 6 mm thick and has index n=1.52. The separation wavelength is again taken to be 700 nm. The width of the wide bandgap cell strips is chosen to be 1.5 mm and the center-to-center separation of the strips to be 5 mm. Table 2 gives for this design the diffraction strip lens grating properties as a function of x, the distance from the lens edge (column 1). Column 2 lists the groove spacing or index modulation period g(x) where g(x) is as shown in FIG. 2, and calculated according to equation 3 for a separation wavelength of 700 nm. Column 3 of Table 2 lists the angles of the diffracted rays at 700 nm wavelength resulting from the diffraction strip lens defined in this way, from equation 1. All the diffracted rays at 700 nm wavelength are brought to the line focus at the strip edge.

Columns 4 and 5 give the blaze angles of diffraction needed for peak diffraction efficiency into first order at 550 nm wavelength and 900 nm wavelength, respectively. For x values up to 1.25 mm, the blaze angle is chosen to maximize efficiency of diffraction at 900 nm, to direct wavelengths longer than the separation wavelength away from the wide bandgap and onto the narrow bandgap cells. For x values from 1.25 to 4 mm the blaze angle is chosen to diffract light at a wavelength of 550 nm away from the narrow bandgap and onto the wide bandgap cells with maximum efficiency. For strip lenses made by volume phase holographic technology, column 6 of Table 2 gives the slant angle (and thus the angle of incidence α) as a function of x needed to obtain the desired Bragg peak wavelengths.

Figure 13:
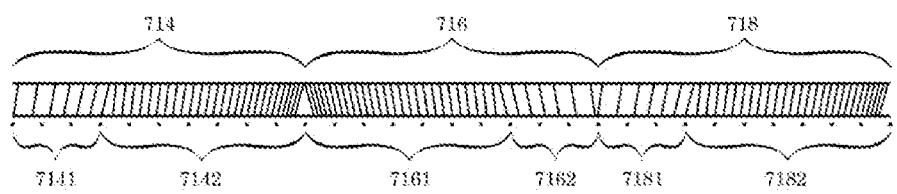
FIG. 13 shows grating elements implemented as volume phase holograms.

FIG. 13 is a schematic diagram showing the strip lens design of Table 2 implemented as volume phase holograms. The tick marks correspond to the 0.25 mm increments in x given in Table 2. Across the first element 714 the spacing decreases monotonically, as shown in column 2. The slant angle across this strip lens is always to the right, as needed to boost −1 order diffraction of rays to the left, as shown for element 714 in FIGS. 4 and 5. In the second strip lens 716 the spacing increases monotonically. The slant angle across this strip lens is always to the left, as needed to boost +1 order diffraction of rays to the right, as shown for strip lens 716 in FIG. 5. Strip lens 718 repeats strip lens 714. Over the first part 7141 of the strip lens 714, the slant angle is chosen to maximize −1 order diffraction at 900 nm, as listed in column 6 of Table 2. Over the second part 7142 of the strip lens 714, the slant angle is chosen to maximize the −1 order diffraction at 550 nm. Over the first part 7161 of the strip lens 716, the slant angle is chosen to maximize +1 order diffraction at 900 nm, while over the second part 7162 of the strip lens 716, the slant angle is chosen to maximize +1 order diffraction at 550 nm.

Effect of Non-Normal Illumination on Spectral Separation.

The analysis given so far for this second embodiment is for the case of illumination by collimated light, i.e. all rays parallel, at normal incidence on the entrance window. In practice, because of the finite angular size of the sun, and because the system may not be ideally oriented perpendicular to the sun, the diffractive separation will be not be perfectly sharp.

Figure 7:
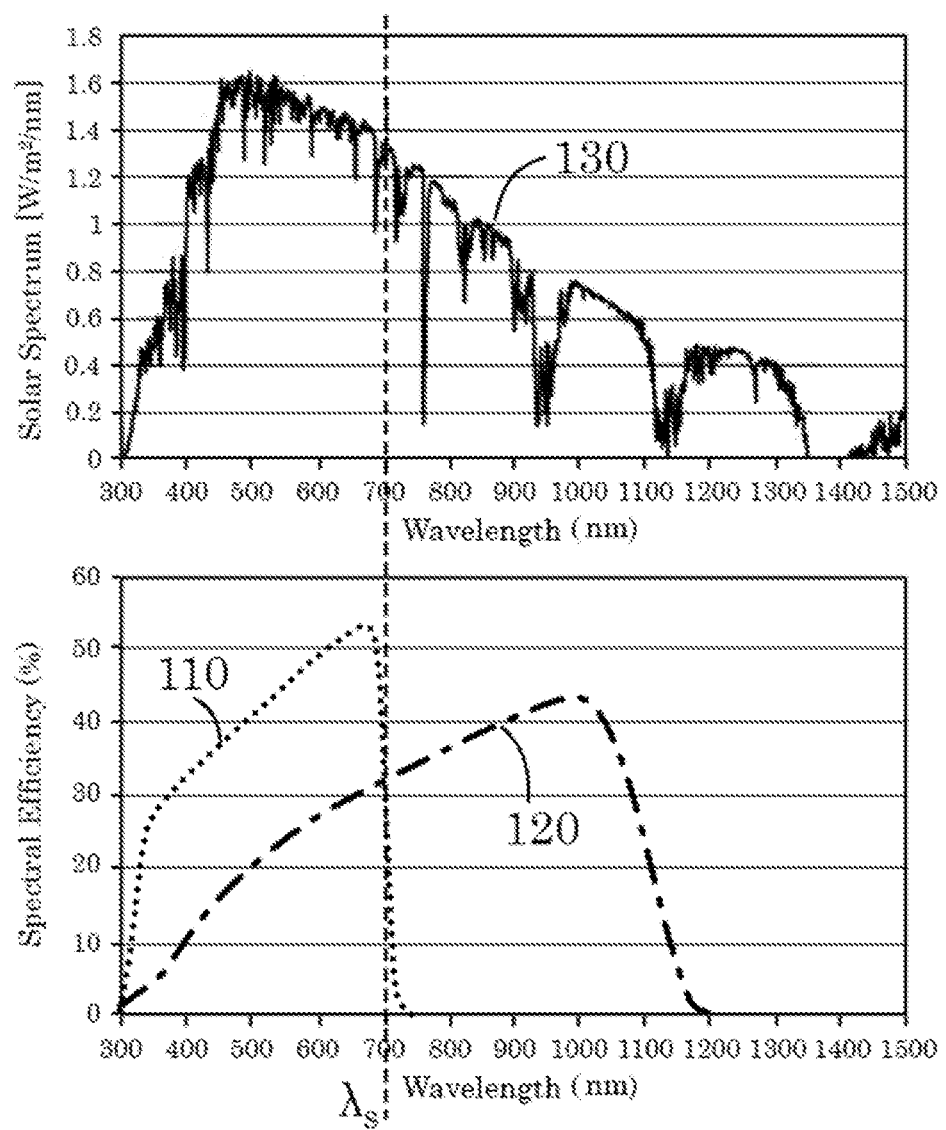
FIG. 7 illustrates a graph of spectral efficiency vs. wavelength for two PV cells having different bandgaps, together with a graph of the spectral distribution of solar energy.
Figure 14:
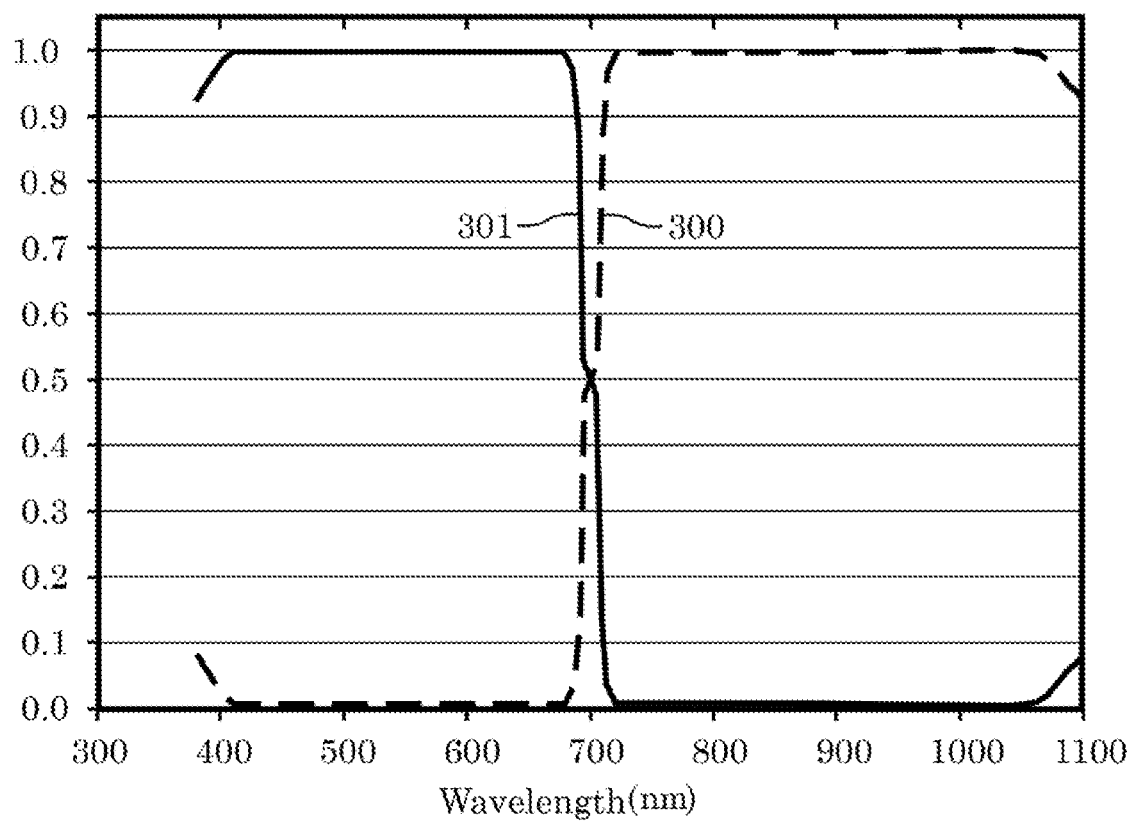
FIG. 14 shows the separation of wavelengths by first order diffraction for the sun at normal incidence for an embodiment on glass.

FIG. 14 shows the separation realized by first order diffraction for different wavelengths when the angular extent of the sun is taken into account. It is assumed that the direction to the center of the sun's disc is normal to the device entrance window, and that thus that rays for the edge of the sun's disc, which is ½ degree in extent, lie at up to ¼ degree off-normal. The resulting spectral separation for first order diffracted rays is plotted for the range of wavelengths from 380 nm, near the shortest extent of the solar spectrum in the ultraviolet, to 1100 nm in the infrared, where, as shown in FIG. 7, the conversion efficiency of silicon is essentially zero. The effect of the finite angular size of the sun is that the separation is no longer perfectly sharp at the 700 nm separation wavelength. The separation region extends from 685 nm to 715 nm. The broadening is less than for embodiment 1, because diffracted rays now pass not through air but glass of refractive index n3 of approximately 1.52, (see equation 4).

Figure 15:
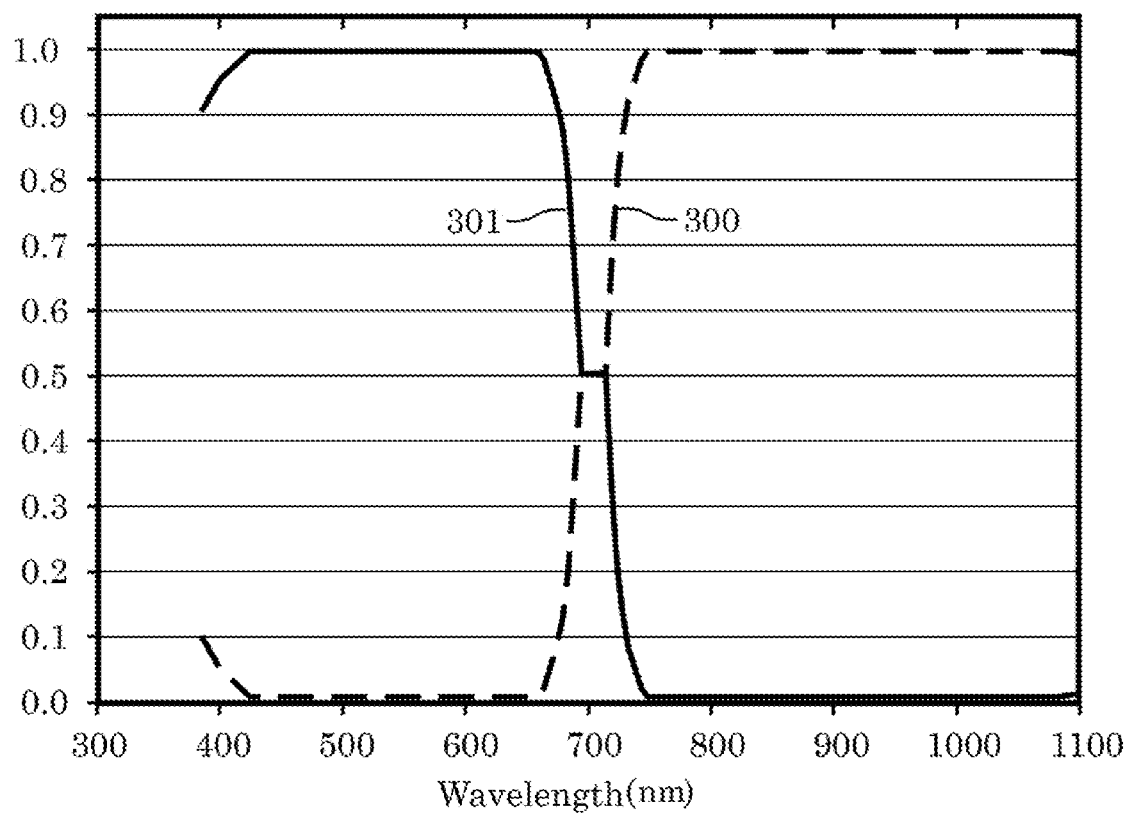
FIG. 15 shows the effect of ½° tracking error on separation of wavelengths by first order diffraction for an embodiment on glass.

FIG. 15 shows the effect of tracking error in which the device with the design given above, with $n_3$=1.52, is pointed away from the center of the sun by ½ degree, in a direction about an axis parallel to the lens and cell strips. In this case, the line focus formed at the separation wavelength from half the strip lenses is displaced onto the wide bandgap cells, and the other half onto the narrow bandgap cells. The separation region now extends from 660 to 740 nm. The shift and broadening is again less than for embodiment 1, because of $n_3$ is increased from 1 to 1.52, see equation 4.

Another type of misalignment will occur if the device is mounted on a single axis tracker whose rotation is about a horizontal axis in a North-South direction, as commonly used in large scale solar installations. The module is oriented so that the strips 4 lie in the N-S direction, as illustrated in FIGS. 1 and 2. The module is turned during the day about a N-S axis 6 so that the sun's rays always enter the module perpendicular to the module edges 9. The sensitivity of the spectral separation to a given skew angle misalignment is then much less than for the case of FIG. 15, but may still be significant for example in winter, when the sun's rays in the middle of the day will at a significant angle φ from the normal to the grating grooves.

Figure 16:
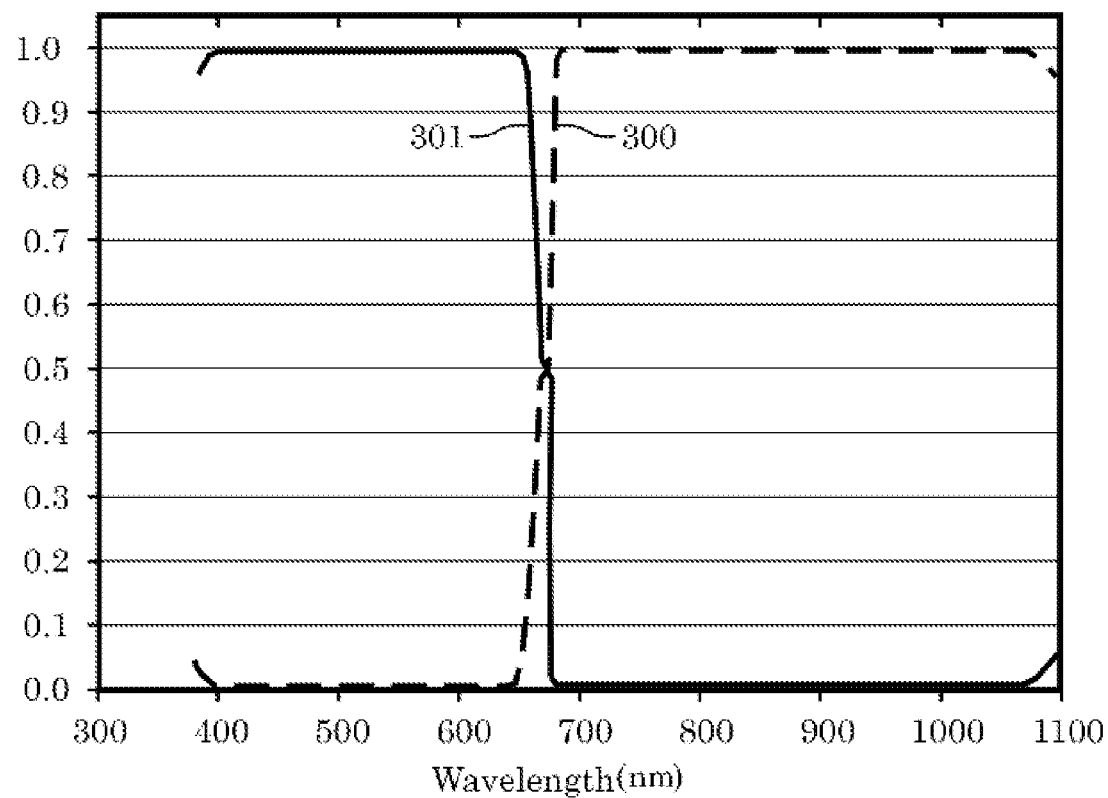
FIG. 16 illustrates the effect of 30° skew angle on spectral separation for an embodiment on glass.

FIG. 16 shows the spectral separation obtained when φ=30 degrees, now for the case with $n_3$=1.52. The separation remains sharp, shifted to a wavelength of 665 nm. The line focus is now formed at the edges of the wide bandgap cell strips at this wavelength. The wavelength shift from 700 nm to 665 nm for φ=30 degrees is less than for embodiment 1, because of refraction in the glass plate. The fraction of the spectrum from 665 to 700 nm that was directed to the wide bandgap cells is now directed to the narrow bandgap cell, where it will be converted with lower efficiency. The overall efficiency reduction from this shift is small, corresponding to ~2.5% relative loss in output power. Even for the most extreme value of φ=55 degrees for the winter solstice at latitude 32.5 degrees, the shift of the separation wavelength is to 600 nm for a worst case 7.5% relative loss. Averaged over the year, the loss from skew illumination for a single axis tracker compared to a dual axis tracker for embodiment 2 is around 1%. Embodiment 2 is in general better performing in terms of both wavelength shift and separation wavelength broadening, because of the mitigating effect of refraction in the glass sheet.

It will be apparent to those familiar with the art that the characteristics of the cells of different bandgaps and the separation wavelengths for the above embodiments are examples only, and for other cells, the optimization will be at other wavelengths.

Those skilled in the art, after having the benefit of this disclosure, will appreciate that modifications and changes may be made to the embodiments described herein, different design parameters and materials may be substituted, equivalent features may be used, changes may be made in the assembly, and additional elements and steps may be added, all without departing from the scope and spirit of the invention. This disclosure has set forth certain presently preferred embodiments and examples only, and no attempt has been made to describe every variation and embodiment that is encompassed within the scope of the present invention. The scope of the invention is therefore defined by the claims appended hereto, and is not limited to the specific examples set forth in the above description.

What is claimed is:

1. A solar PV module for generation of electricity when mounted on a single axis tracker, characterized in that a first type of PV cells are provided having a first wider bandgap, and a second type of PV cells are provided having a second narrower bandgap;

a receiving plane is provided with a plurality of strips of the first type of PV cells having a first wider bandgap, and having a plurality of strips of the second type of PV cells having a second narrower bandgap, where the strips of the first type of PV cells are laterally-separated and arrayed in alternating strips with the strips of the second type of PV cells, such that there are alternating strips of wider and narrower bandgap PV cells, where all of the strips are oriented parallel to the single axis of tracking;

a planar entrance surface spaced ahead of and parallel to the receiving plane, arrayed with linear transmission diffraction strip lenses covering essentially the full area of the entrance surface, the diffracting strip lenses configured in opposing pairs, each pair being associated with, parallel to and located above a first type of PV cells having a wider bandgap, in which sunlight is spectrally divided and directed preferentially toward the first type of PV cells and the second type of PV cells, respectively;

the diffracting strip lens in each paired strip lens being constructed with variable pitch, such that light at a single separation wavelength $\lambda_s$, on entering the first side of a strip lens is diffracted in first (+1) order to cross over a first edge of a strip of the first type of PV cells below to focus in a line along a second edge of said strip of the first type of PV cells, and light at the single separation wavelength $\lambda_s$, on entering the second side of a strip lens is diffracted in first (−1) order to cross over the second edge of said strip of the first type of PV cells below to focus in a line along the first edge of said strip of the first type of PV cells, an arrangement called a "cross eyed strip lens";

wherein the module thus constructed with cross-eyed strip lenses and alternating strips of first and second types of PV cells has the desired property that shorter wavelengths $\lambda < \lambda_s$ are cross-diffracted onto strips of the first type of PV cells having a wider bandgap, while longer wavelengths $\lambda > \lambda_s$ are diffracted onto intervening strips of the second type of PV cells having a narrower bandgap.

2. The solar PV module of claim 1 characterized in that the diffracting strip lenses are volume phase gratings with variable Bragg plane spacing and tilt.

3. The solar PV module of claim 1 characterized in that the diffracting strip lenses are diffraction gratings with variable groove spacing and blaze angle.

4. The solar PV module of claim 1 in which the diffractive strip lenses are tuned to have highest efficiency in first order diffraction according to position across the lens: in those regions of the diffractive strip lens that lie above a strip of the first type of PV cells having a first wider bandgap where directly transmitted sunlight ($0^{th}$ order diffraction) would pass through to said strip, the strip lens is tuned to have highest efficiency for first order diffraction at longer wavelengths $\lambda > \lambda_s$, which would not be converted by the first type of PV cells having a first wider bandgap, and conversely, in those regions of the diffractive strip lens where directly transmitted light ($0^{th}$ order) would pass through to a strip of the second type of PV cells having a second narrower bandgap, the strip lens is tuned to have highest efficiency for first order diffraction at shorter wavelengths $\lambda < \lambda s$, which are less efficiently converted by the second type of PV cells.

5. The solar PV module of claim 1 constructed using a flat sheet of glass or other transparent material with diffracting lenses bonded to the entrance face of the glass and photovoltaic cells bonded to the back face of the glass; wherein sunlight is transmitted by the glass from the diffracting lenses to the cells with no air path, thus minimizing dielectric reflection losses, spectral imbalance caused by sunlight entering the module at skew angles, and loss of light by soiling.

* * * * *